(12) United States Patent
Kanakamedala et al.

(10) Patent No.: US 11,114,406 B2
(45) Date of Patent: Sep. 7, 2021

(54) WARPAGE-COMPENSATED BONDED STRUCTURE INCLUDING A SUPPORT CHIP AND A THREE-DIMENSIONAL MEMORY CHIP

(71) Applicant: SANDISK TECHNOLOGIES LLC, Addison, TX (US)

(72) Inventors: Senaka Kanakamedala, San Jose, CA (US); Raghuveer S. Makala, Campbell, CA (US); Yao-Sheng Lee, Tampa, FL (US); Jian Chen, Menlo Park, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 31 days.

(21) Appl. No.: 16/263,058

(22) Filed: Jan. 31, 2019

(65) Prior Publication Data
US 2020/0251443 A1    Aug. 6, 2020

(51) Int. Cl.
*H01L 23/48* (2006.01)
*H01L 23/52* (2006.01)
(Continued)

(52) U.S. Cl.
CPC .......... *H01L 24/81* (2013.01); *H01L 21/0217* (2013.01); *H01L 21/0337* (2013.01);
(Continued)

(58) Field of Classification Search
CPC . H01L 24/05; H01L 21/0206; H01L 21/0274; H01L 24/13; H01L 24/11
See application file for complete search history.

(56) References Cited

U.S. PATENT DOCUMENTS

| | | | |
|---|---|---|---|
| 5,597,469 A | * | 1/1997 | Carey .................. C25D 5/022 205/118 |
| 5,915,167 A | | 6/1999 | Leedy |

(Continued)

OTHER PUBLICATIONS

USPTO Office Communication, Non-Final Office Action for U.S. Appl. No. 16/263,086, dated Mar. 18, 2020, 12 pages.

(Continued)

*Primary Examiner* — Brian Turner
(74) *Attorney, Agent, or Firm* — The Marbury Law Group PLLC

(57) ABSTRACT

A first semiconductor die and a second semiconductor die can be bonded in a manner that enhances alignment of bonding pads. Non-uniform deformation of a first wafer including first semiconductor dies can be compensated for by forming a patterned stress-generating film on a backside of the first wafer. Metallic bump portions can be formed on concave surfaces of metallic bonding pads by a selective metal deposition process to reduce gaps between pairs of bonded metallic bonding pads. Pad-to-pad pitch can be adjusted on a semiconductor die to match the pad-to-pad pitch of another semiconductor die employing a tilt-shift operation in a lithographic exposure tool. A chuck configured to provide non-uniform displacement across a wafer can be employed to hold a wafer in a contoured shape for bonding with another wafer in a matching contoured position. Independently height-controlled pins can be employed to hold a wafer in a non-planar configuration.

6 Claims, 30 Drawing Sheets

(51) Int. Cl.
| | |
|---|---|
| *H01L 25/065* | (2006.01) |
| *H01L 23/00* | (2006.01) |
| *H01L 25/18* | (2006.01) |
| *H01L 23/538* | (2006.01) |
| *H01L 21/822* | (2006.01) |
| *H01L 21/033* | (2006.01) |
| *H01L 23/522* | (2006.01) |
| *H01L 25/00* | (2006.01) |
| *H01L 21/02* | (2006.01) |
| *H01L 21/66* | (2006.01) |
| *H01L 21/67* | (2006.01) |
| *H01L 27/11582* | (2017.01) |

(52) U.S. Cl.
CPC ...... *H01L 21/67288* (2013.01); *H01L 21/822* (2013.01); *H01L 22/12* (2013.01); *H01L 23/5226* (2013.01); *H01L 23/5383* (2013.01); *H01L 24/03* (2013.01); *H01L 24/04* (2013.01); *H01L 24/05* (2013.01); *H01L 24/09* (2013.01); *H01L 24/16* (2013.01); *H01L 24/17* (2013.01); *H01L 24/75* (2013.01); *H01L 24/80* (2013.01); *H01L 24/94* (2013.01); *H01L 25/18* (2013.01); *H01L 25/50* (2013.01); *H01L 21/02274* (2013.01); *H01L 23/481* (2013.01); *H01L 27/11582* (2013.01); *H01L 2224/0362* (2013.01); *H01L 2224/03616* (2013.01); *H01L 2224/03916* (2013.01); *H01L 2224/0401* (2013.01); *H01L 2224/05557* (2013.01); *H01L 2224/05571* (2013.01); *H01L 2224/16147* (2013.01); *H01L 2224/75001* (2013.01); *H01L 2224/75983* (2013.01); *H01L 2224/75986* (2013.01); *H01L 2224/80001* (2013.01); *H01L 2224/81143* (2013.01); *H01L 2224/81191* (2013.01); *H01L 2224/81345* (2013.01); *H01L 2224/81948* (2013.01); *H01L 2924/3511* (2013.01); *H01L 2924/381* (2013.01)

(56) References Cited

U.S. PATENT DOCUMENTS

| | | | | |
|---|---|---|---|---|
| 6,353,266 | B1* | 3/2002 | Okamura | H01L 24/05 |
| | | | | 257/786 |
| 9,343,358 | B1 | 5/2016 | Xi | |
| 2006/0035453 | A1* | 2/2006 | Kim | H05K 1/111 |
| | | | | 438/613 |
| 2008/0257595 | A1* | 10/2008 | Hu | H01L 24/11 |
| | | | | 174/261 |
| 2008/0315433 | A1* | 12/2008 | Chen | H01L 23/66 |
| | | | | 257/777 |
| 2012/0049367 | A1* | 3/2012 | Migita | H01L 24/05 |
| | | | | 257/738 |
| 2013/0256881 | A1* | 10/2013 | Morifuji | H01L 23/3171 |
| | | | | 257/737 |
| 2014/0004697 | A1* | 1/2014 | Shen | H01L 24/11 |
| | | | | 438/614 |
| 2015/0235984 | A1* | 8/2015 | Aoyagi | B23K 20/10 |
| | | | | 438/107 |
| 2015/0357226 | A1 | 12/2015 | Liu et al. | |
| 2016/0049435 | A1 | 2/2016 | Goel et al. | |
| 2017/0345786 | A1 | 11/2017 | Chen et al. | |
| 2018/0068861 | A1 | 3/2018 | deVilliers | |
| 2018/0090307 | A1 | 3/2018 | Brunner et al. | |
| 2018/0151527 | A1* | 5/2018 | Chang | H01L 21/31116 |
| 2018/0374865 | A1 | 12/2018 | Shimabukuro et al. | |
| 2019/0385971 | A1 | 12/2019 | Omori et al. | |

OTHER PUBLICATIONS

Makala, R.S., "Warpage-Compensated Bonded Structure Including a Support Chip and a Three-Dimensional Memory Chip," U.S. Appl. No. 16/263,086, filed Jan. 31, 2019.

Notification of Transmittal of the International Search Report and Written Opinion of the International Search Authority or International Patent Application No. PCT/US2019/062358, dated Mar. 4, 2020, 13 pages.

Endoh, T. et al., "Novel Ultra High Density Flash Memory with a Stacked-Surrounding Gate Transistor (S-GT) Structured Cell," IEDM Proc., pp. 33-36, (2001).

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/251,954, filed Jan. 18, 2019, SanDisk Technologies LLC.

* cited by examiner

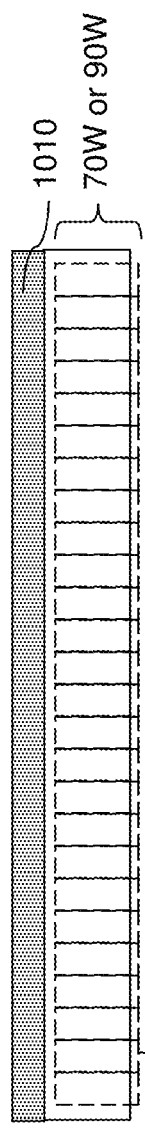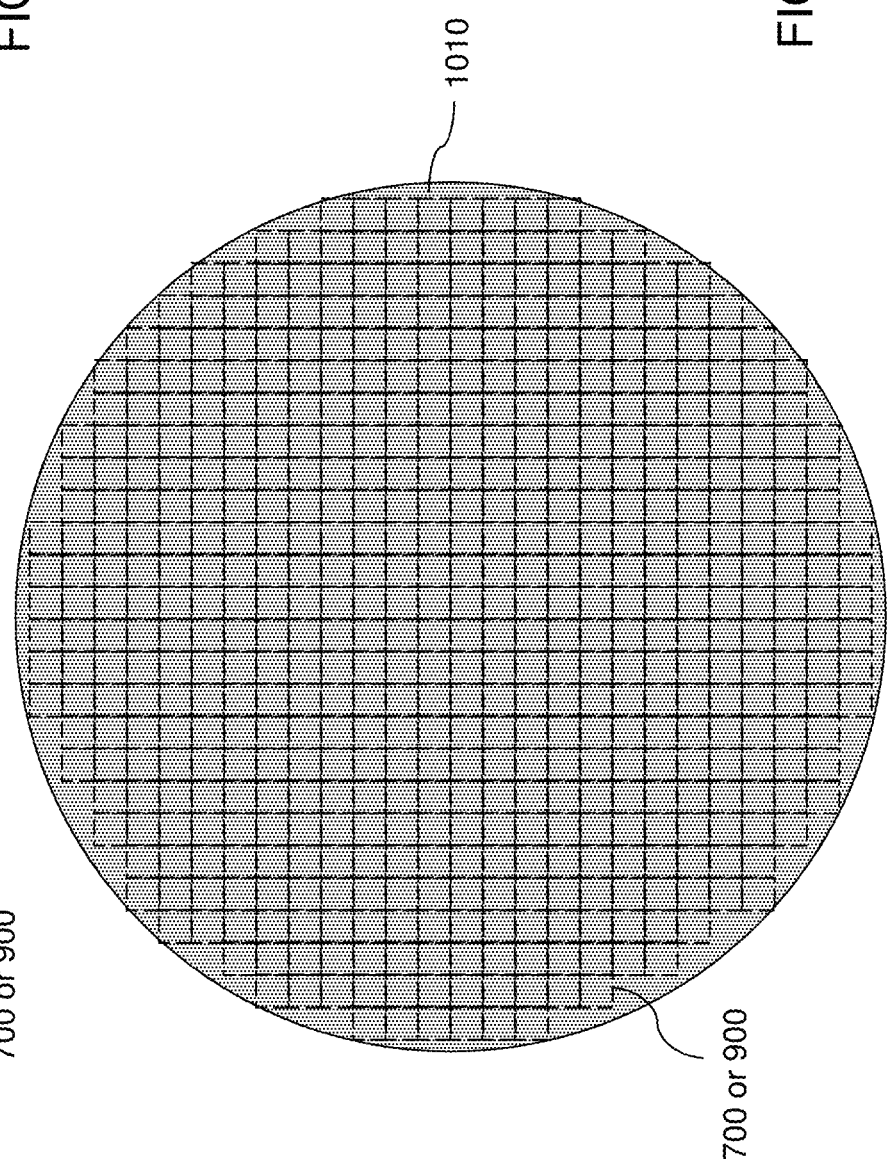

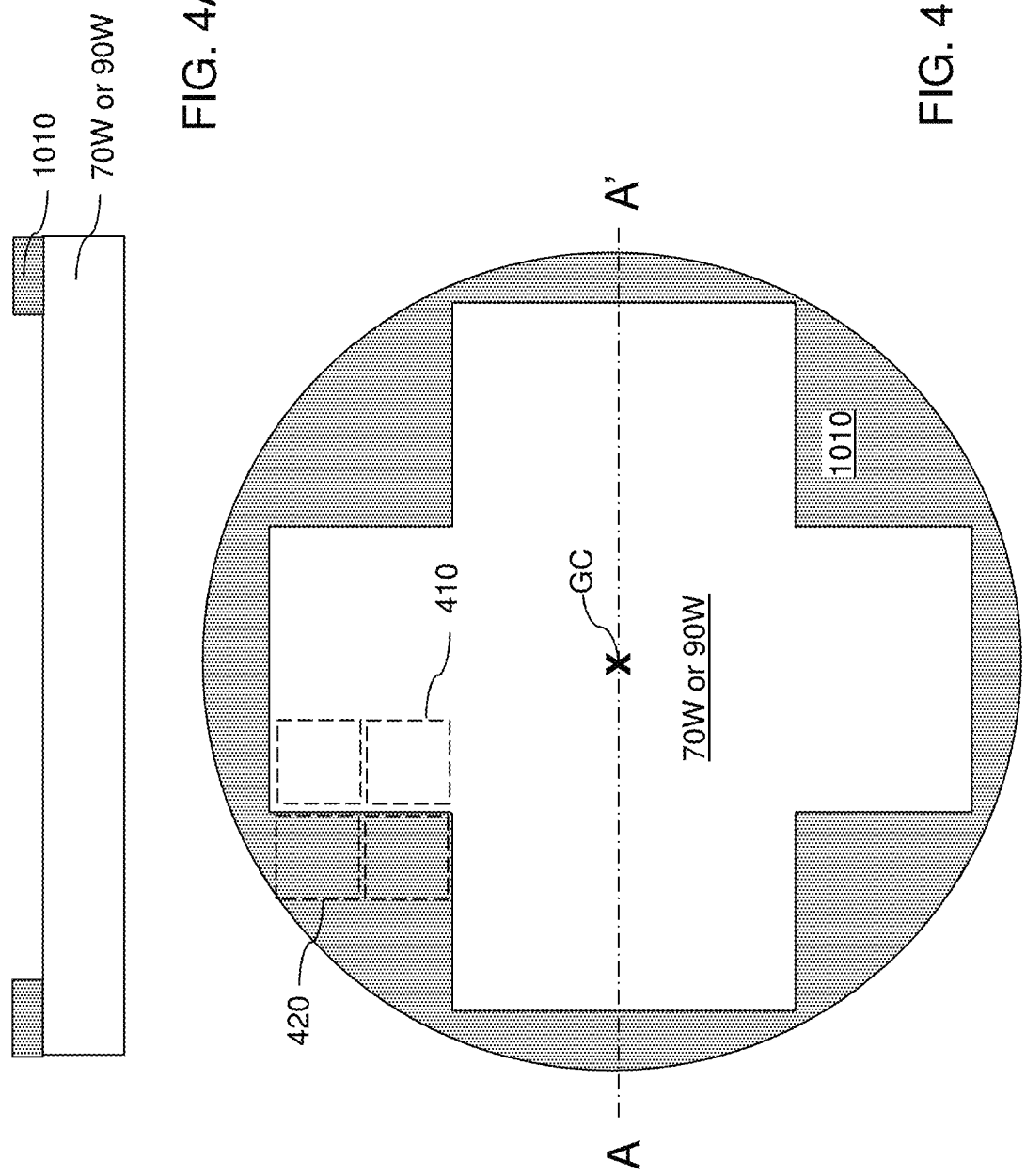

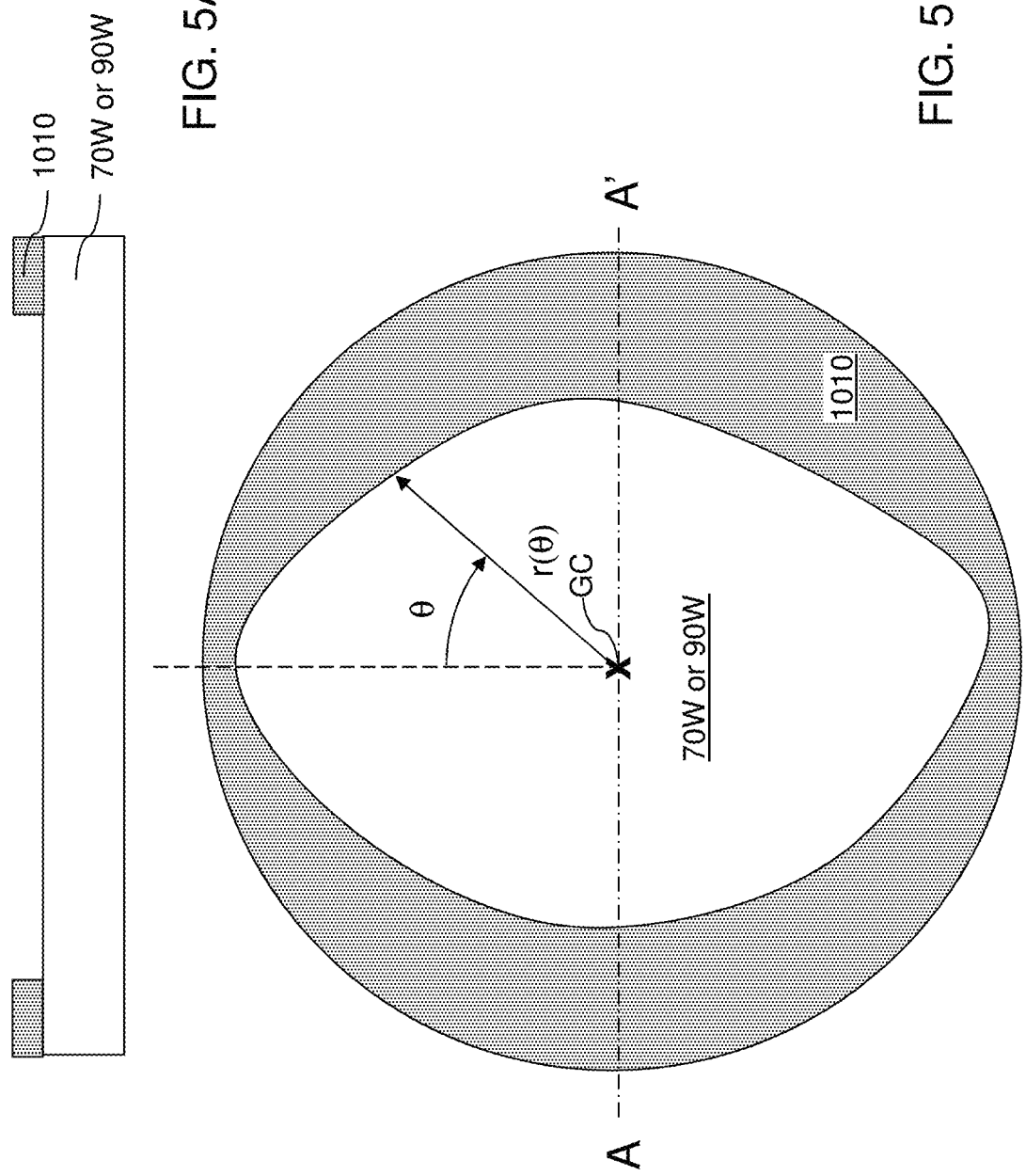

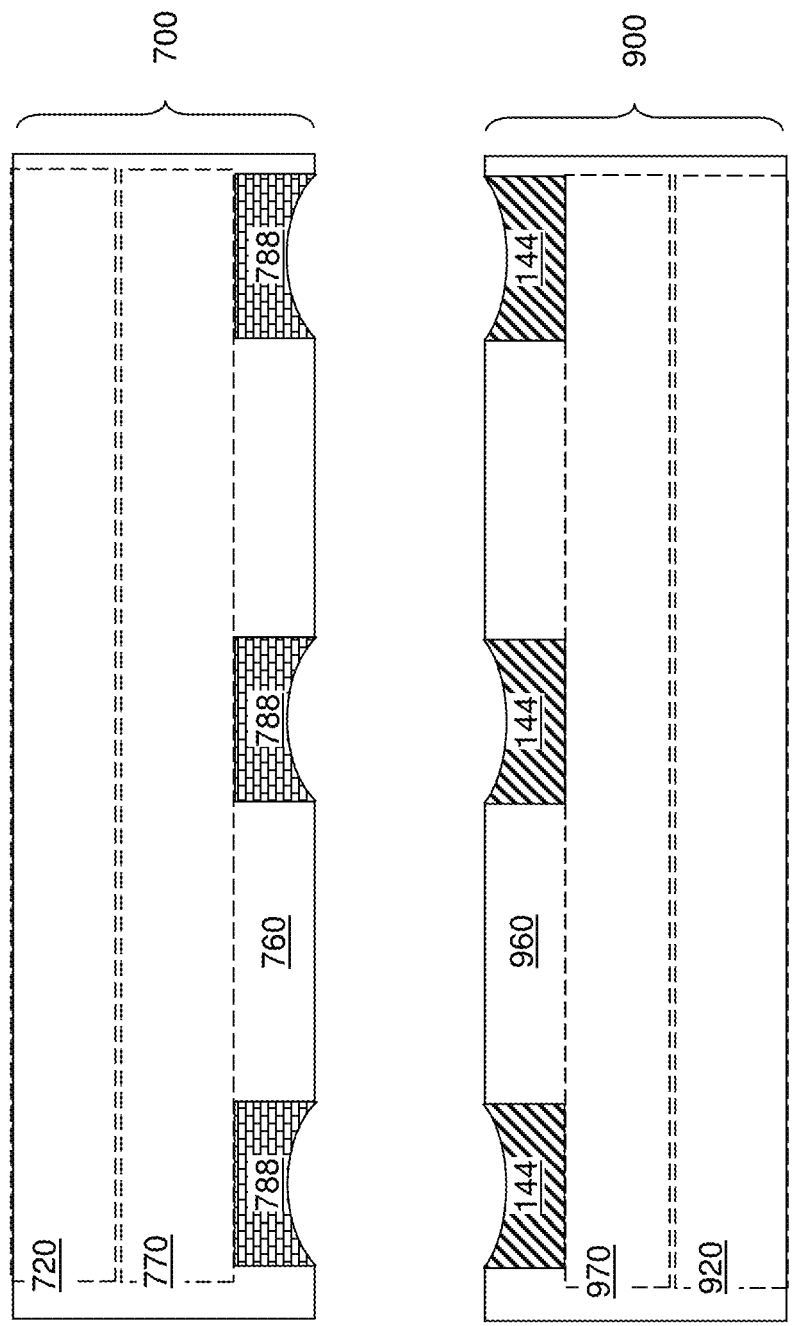

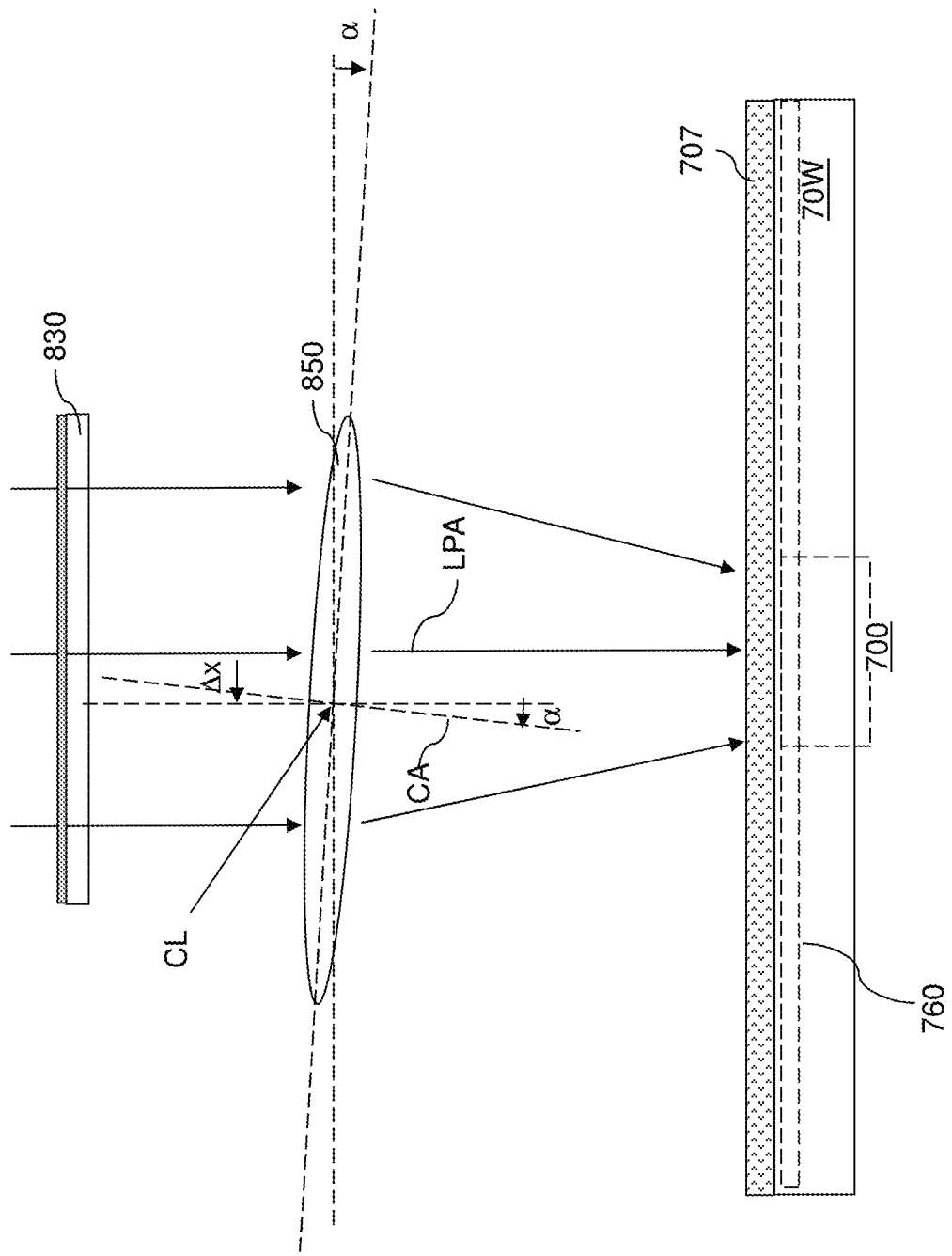

WARPAGE-COMPENSATED BONDED STRUCTURE INCLUDING A SUPPORT CHIP AND A THREE-DIMENSIONAL MEMORY CHIP

FIELD

The present disclosure relates generally to the field of semiconductor devices, and particularly to warpage-compensated bonded structures including a support die and a three-dimensional memory die and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a semiconductor structure is provided, which comprises: forming a plurality of first semiconductor dies on a first wafer, wherein the first wafer is strained due to stress generated by the plurality of first semiconductor dies; depositing a stress-generating film on a backside of the first wafer; patterning the stress-generating film with a pattern that does not have a continuous rotational symmetry around a perpendicular axis that passes through a geometrical center of the first wafer, wherein a patterned stress-generating film is provided on the backside of the first wafer; providing a second wafer including a plurality of second semiconductor dies; and bonding the second wafer to the first wafer while the patterned stress-generating film is present on the backside of the first wafer.

According to another aspect of the present disclosure, a method of forming a semiconductor structure is provided, which comprises: providing a first semiconductor die including first semiconductor devices, first metal interconnect structures, and first metal bonding pads having first concave top surfaces; forming metallic bump portions directly on the first concave top surfaces of the first metal bonding pads by selectively depositing a metallic material on the first concave top surfaces of the first metal bonding pads; providing a second semiconductor die including second semiconductor devices, second metal interconnect structures, and second metal bonding pads; and attaching the second semiconductor die to the first semiconductor die by bonding the second metal bonding pads to the metallic bump portions via metal-to-metal bonding.

According to even another aspect of the present disclosure, a method of forming a semiconductor structure is provided, which comprises: providing a first semiconductor die including first semiconductor devices, first metal interconnect structures, and first metal bonding pads that are laterally spaced apart with a first pad-to-pad pitch; providing a second semiconductor die including second semiconductor devices and second metal interconnect structures; and forming second metal bonding pads on the second metal interconnect structures with a second pad-to-pad pitch employing a lithographic exposure process in which a tilt-shift operation is performed on a lens of an exposure tool, wherein the lithographic process defines a pattern for the second metal bonding pads.

According to yet another aspect of the present disclosure, a method of forming a semiconductor structure is provided, which comprises: forming a plurality of first semiconductor dies on a first wafer, wherein the first wafer has a non-planar backside surface due to stress generated by the plurality of first semiconductor dies; disposing the first wafer on a first chuck, wherein the first chuck includes a plurality of first pins configured to provide a local vertical displacement of the non-planar backside surface of the first wafer from a planar top surface of the first chuck; providing non-uniform vertical displacement to the first pins to provide structural support to the first wafer; disposing a second wafer including a plurality of second semiconductor dies over the first wafer; and bonding the plurality of second semiconductor dies to the plurality of first semiconductor dies while the first wafer is disposed over the first chuck.

According to still another aspect of the present disclosure, a wafer bonding apparatus is provided, which comprises: a first chuck comprising: a first perforated platen that includes an array of first openings therethrough and a first planar surface, and first pins configured to move through the array of first openings and to contact a backside surface of a first wafer that is disposed on the first planar surface; and a computer including a processor and a memory in communication with the processor and configured to control vertical movement of the first pins.

According to another aspect of the present disclosure, a method of forming a semiconductor structure is provided, which comprises: providing a first wafer including a plurality of first semiconductor dies; providing a second wafer including a plurality of second semiconductor dies; and bonding the second wafer to the first wafer face to face while an interface between the first wafer and the second wafer is in a non-Euclidean two-dimensional plane.

BRIEF DESCRIPTION OF THE DRAWINGS

FIG. 1A is a vertical cross-sectional view of a first exemplary wafer including a plurality of semiconductor dies after deposition of a stress-generating film according to a first embodiment of the present disclosure.

FIG. 1B is a plan view of a backside of the first exemplary wafer of FIG. 1A.

FIG. 4A is a vertical cross-sectional view of the first exemplary wafer after patterning the stress-generating film with a third exemplary pattern according to the first embodiment of the present disclosure.

FIG. 4B is a plan view of a backside of the first exemplary wafer of FIG. 4A.

FIG. 5A is a vertical cross-sectional view of the first exemplary wafer after patterning the stress-generating film with a fourth exemplary pattern according to the first embodiment of the present disclosure.

FIG. 5B is a plan view of a backside of the first exemplary wafer of FIG. 5A.

FIG. 6A is a vertical cross-sectional view of a first semiconductor die in a first wafer and a second semiconductor die in a second wafer after formation of metal pad structures therein according to a second embodiment of the present disclosure.

FIG. 8A is a vertical cross-sectional view of a second exemplary wafer including support dies during lithographic exposure in an exposure tool employing a tilt-shift operation according to a third embodiment of the present disclosure.

DETAILED DESCRIPTION

Figure 2A:
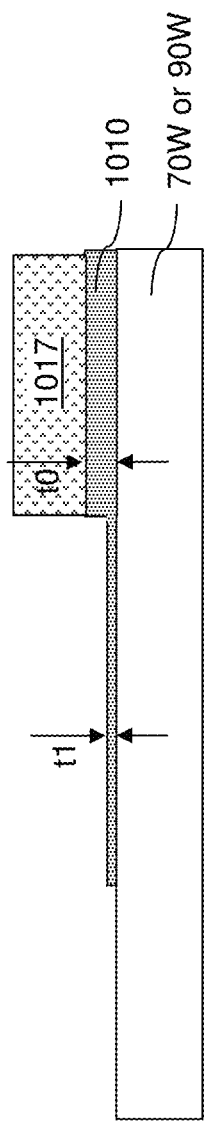
FIG. 2A is a vertical cross-sectional view of the first exemplary wafer after patterning the stress-generating film with a first exemplary pattern according to the first embodiment of the present disclosure.

Complementary metal oxide semiconductor (CMOS) devices can be formed on a same substrate as a three-dimensional memory device. However, degradation of CMOS devices due to collateral thermal cycling and hydrogen diffusion during manufacture of the three-dimensional memory device places a constraint on performance of the support circuitry including the CMOS devices. A bonded assembly of a memory die and a support die can be used as an alternative. However, bending and warpage of the memory die due to internally-generated stress and bonding it to a relatively flatter (e.g., less warped) support die presents a challenge. Embodiments of the present disclosure provide warpage-compensation methods and structures for improving yield of bonded assemblies containing a memory die and a support die, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIGS. 1A and 1B, a first exemplary wafer (70W or 90W) is illustrated, which may be a support wafer 70W including a plurality of support dies 700 or a memory wafer 90W including a plurality of memory dies 900. In case the first exemplary wafer (70W or 90W) comprises a memory wafer 90W including a plurality of memory dies 900, each memory die 900 may include a three-dimensional array of memory elements. In one embodiment, the three-dimensional array of memory elements can include a two-dimensional array of vertical NAND strings that extend through an alternating stack of insulating layers and electrically conductive layers. The mechanical stress generated by components of the memory dies 900, such as the electrically conductive layers or other metallic or dielectric components, can induce deformation of the memory wafer 900. In an illustrative example, the memory wafer 900 may have a compressive stress on the top side that includes various components of a three-dimensional array of memory elements, and the memory wafer may have a convex top surface and a concave bottom surface. In case the first exemplary wafer (70W or 90W) comprises a support wafer 70W including a plurality of support dies 900, each support die 900 may include a set of semiconductor devices such as field effect transistors, junction transistors, diodes, capacitors, or other types of semiconductor devices. Each support die 900 can include a peripheral circuitry configured to control operation of a memory die 800 that can be subsequently bonded thereupon. The mechanical stress generated by components of the support dies 700, such as stress-inducing dielectric liners, can induce deformation of the support wafer 900.

The deformation pattern of the first exemplary wafer (70W or 90W) is two-dimensional, and can include radially-varying components and azimuthally-varying components. In one embodiment, the first exemplary wafer (70W or 90W) can have a horizontal cross-sectional shape of a circle with an optional notch or a flat. In this case, deformation of the first exemplary wafer (70W or 90W) can be described employing Zernike polynomials, which are a sequence of polynomials that are orthogonal on a unit disk. The total deformation of the first exemplary wafer (70W or 90W) can be represented as a sum of weighted Zernike polynomials in which the coefficient for each Zernike polynomial represents the magnitude of a deformation component that has the two-dimensional deformation profile represented by the corresponding Zernike polynomial. For example, $Z_0^2$ $(r,\theta)$ represents an azimuthally independent component that provides radial concavity or convexity, $Z_1^1$ $(r,\theta)$ represents a deformation component that is proportional to the product of the radial distance and $\cos(\theta)$ (which is the x-axis coordinate), $Z_1^{-1}$ $(r,\theta)$ represents a deformation component that is proportional to the product of the radial distance and $\sin(\theta)$ (which is the y-axis coordinate), $Z_2^2$ $(r,\theta)$ represents a deformation component that is proportional to the product of the radial distance and $\cos(2\theta)$, $Z_2^{-2}$ $(r,\theta)$ represents a deformation component that is proportional to the product of the radial distance and $\sin(2\theta)$, etc.

According to an aspect of the present disclosure, a stress-generating film 1010 is deposited on the backside of the first exemplary wafer (70W or 90W). The stress-generating film 1010 includes a dielectric material that can apply a compressive stress or a tensile stress. Generally, the type of stress applied by the stress-generating film 1010 matches the type of excess stress that is present on the front side of the first exemplary wafer (70W or 90W) relative to the stress that is present on the backside of the first exemplary wafer (70W or 90W). The type of excess stress present on the front side of the first exemplary wafer (70W or 90W) can be determined by observing the general concavity of convexity of the front side surface of the first exemplary wafer (70W or 90W), which corresponds to the sign of the coefficient of the Zernike polynomial $Z_0^2$ $(r,\theta)$. If the front side surface of the first exemplary wafer (70W or 90W) is concave and the backside surface of the first exemplary wafer (70W or 90W) is convex, the excess stress on the front side of the first exemplary wafer (70W or 90W) is tensile, and the stress-generating film 1010 can apply a tensile stress that is approximately the same as the magnitude of the excess tensile stress on the front side of the first exemplary wafer (70W or 90W). If the front side surface of the first exemplary wafer (70W or 90W) is convex and the backside surface of the first exemplary wafer (70W or 90W) is concave, the excess stress on the front side of the first exemplary wafer (70W or 90W) is compressive, and the stress-generating film 1010 can apply a compressive stress that is approximately the same as the magnitude of the excess compressive stress on the front side of the first exemplary wafer (70W or 90W).

In one embodiment, the stress-generating film 1010 includes a stress-generating dielectric material such as silicon nitride. The type of stress and the magnitude of stress that silicon nitride generates depends on the composition of silicon nitride (such as the ratio between the silicon atoms and the nitrogen atoms, i.e., the degree of silicon-richness or silicon-deficiency). A silicon nitride film can generate a tensile stress or compressive stress having a magnitude up to 2 GPa. The silicon nitride material for the stress-generating film 1010 can be deposited by plasma enhanced chemical vapor deposition. The thickness of the stress-generating film 1010 can be in a range from 50 nm to 1,000 nm, although lesser and greater thicknesses can also be employed. In case the all other components of the Zernike polynomials representing the deformation of the first exemplary wafer (70W or 90W) are zero, i.e., if the only deformation mode of the first exemplary wafer (70W or 90W) is the mode corresponding to the Zernike polynomial $Z_0^2$ $(r,\theta)$, the deformation of the first exemplary wafer (70W or 90W) prior to deposition of the stress-generating film 1010 can be completely cancelled upon deposition of the stress-generating film 1010. In other words, the first exemplary wafer (70W or 90W) can be completely flattened upon deposition of the stress-generating film 1010. The memory dies 900 or the support dies 700 in the first exemplary wafer (70W or 90W) can be diced, and can be subsequently bonded with a matching die to provide bonded chips including a memory die and a support die.

In case other components of the Zernike polynomials representing the deformation of the first exemplary wafer (70W or 90W) are non-zero, i.e., the deformation of the first exemplary wafer (70W or 90W) includes additional deformation modes, the deformation of the first exemplary wafer (70W or 90W) prior to deposition of the stress-generating film 1010 is not cancelled upon deposition of the stress-generating film 1010. According to an aspect of the present disclosure, the stress-generating film 1010 can be subsequently patterned with one or more thicknesses to provide azimuthally and/or radially dependent stress compensation.

Figure 2B:
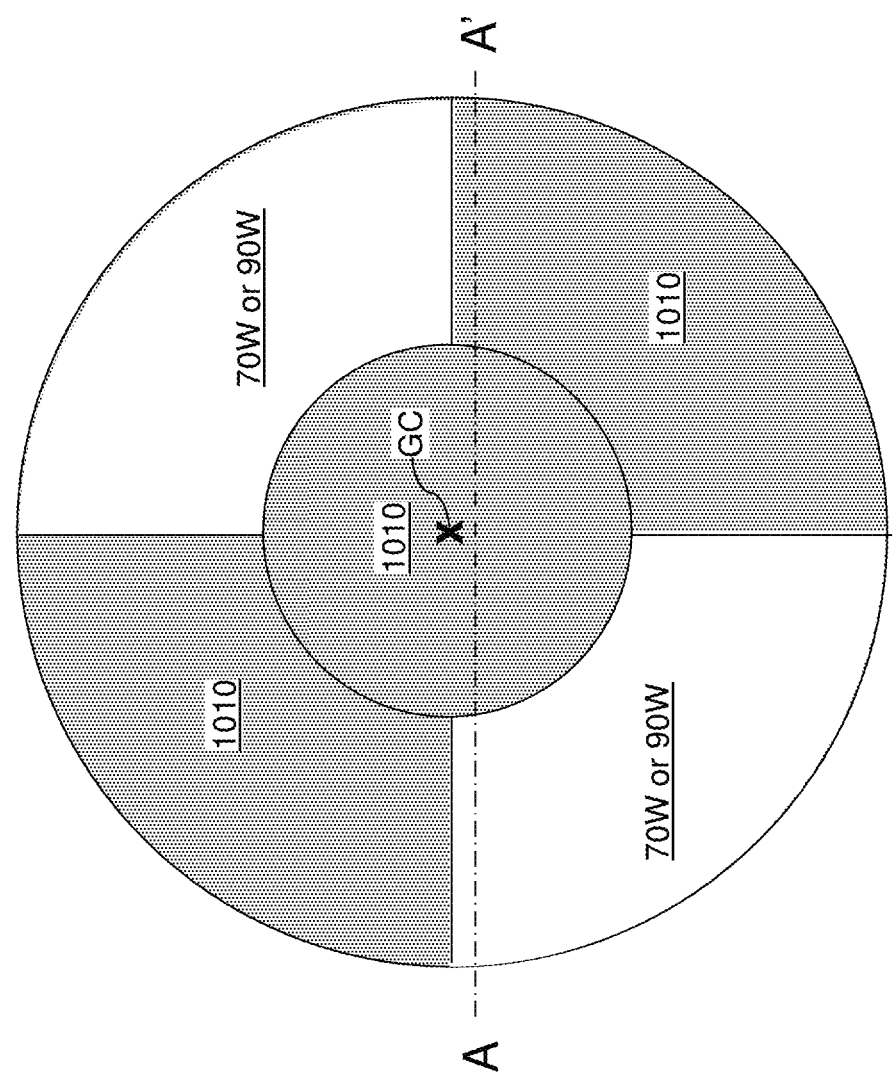
FIG. 2B is a plan view of a backside of the first exemplary wafer of FIG. 2A.
Figure 3A:
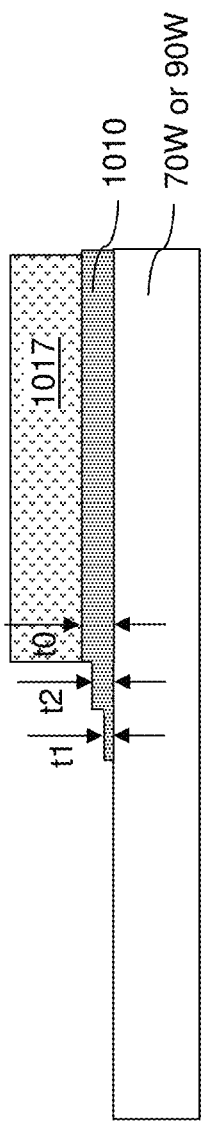
FIG. 3A is a vertical cross-sectional view of the first exemplary wafer after patterning the stress-generating film with a second exemplary pattern according to the first embodiment of the present disclosure.
Figure 3B:
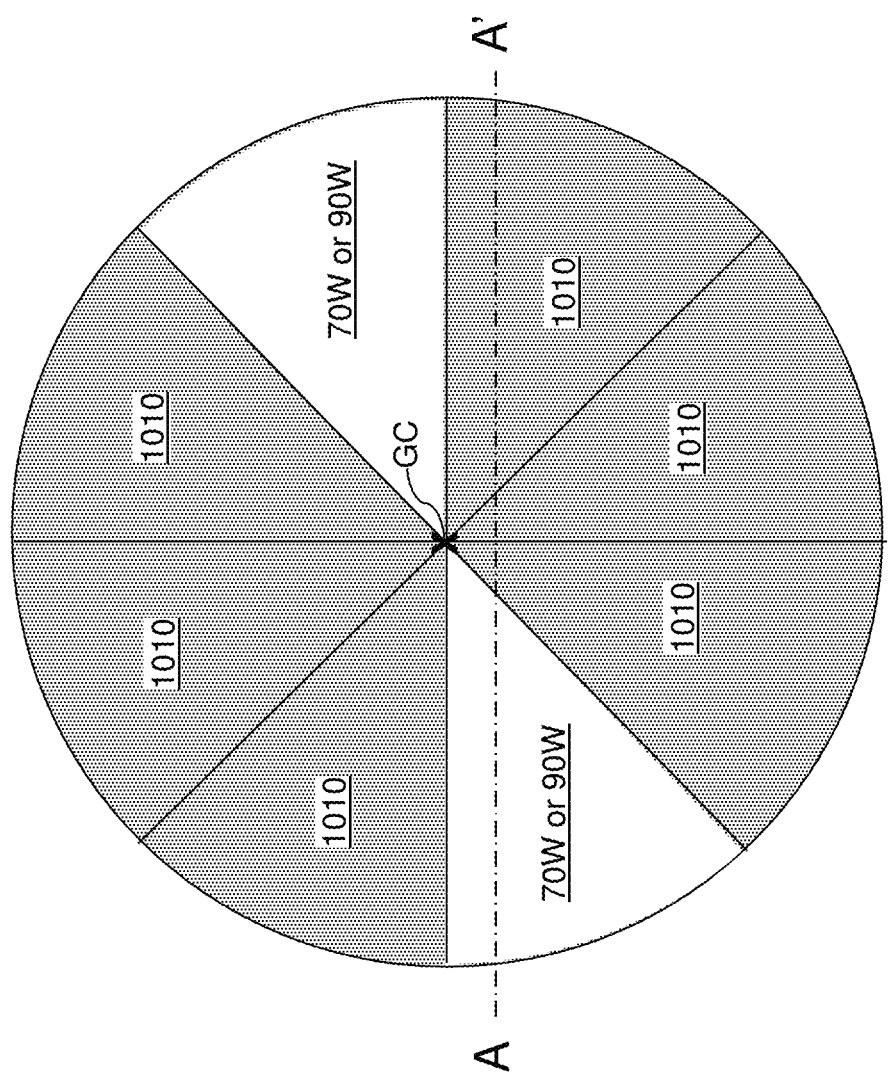
FIG. 3B is a plan view of a backside of the first exemplary wafer of FIG. 3A.

Referring to FIGS. 2A, 2B, 3A, 3B, 4A, 4B, 5A, and 5B, various patterns for partially of fully etching the stress-generating film 1010 are illustrated. FIGS. 2A and 2B illustrate a first exemplary pattern for a patterned stress-generating film 1010, FIGS. 3A and 3B illustrate a second exemplary pattern for a patterned stress-generating film 1010, FIGS. 4A and 4B illustrate a third exemplary pattern for a patterned stress-generating film 1010, and FIGS. 5A and 5B illustrate a fourth exemplary pattern for a patterned stress-generating film 1010.

Generally, a plurality of first semiconductor dies (700 or 900) is provided on a first wafer (70W or 90W). The first wafer (70W or 90W) is strained due to stress generated by the plurality of first semiconductor dies (700 or 900). A stress-generating film 1010 can be deposited on a backside of the first wafer (70W or 90W) as illustrated in FIGS. 1A and 1B. The stress-generating film 1010 can be patterned with a pattern that does not have a continuous rotational symmetry around a perpendicular axis that passes through a geometrical center GC of the first wafer (70W or 90W). A patterned stress-generating film 1010 is provided on the backside of the first wafer (70W or 90W). As used herein, a "continuous rotational symmetry" of an element refers to a symmetry in which the element is invariant under rotation by an arbitrary angle. In other words, the radial extent or thickness of the patterned stress-generating film 1010 varies with an azimuthal angle within at least one azimuthal range, which may, or may not, include the entire range of the azimuthal angle (i.e., from 0 degrees to 360 degrees).

Referring back to FIGS. FIGS. 2A, 2B, 3A, 3B, 4A, 4B, 5A, and 5B, the patterning of the stress-generating film 1010 can be performed by applying and patterning an etch mask layer 1017 over the stress-generating film 1010 over the backside of the first wafer (70W or 90W). A first area of the backside of the first wafer (70W or 90W) is not masked by the etch mask layer 1017, and a second area of the backside of the first wafer (70W or 90W) is masked by the etch mask layer 1017. In one embodiment, the etch mask layer 1017 can be a photoresist layer that can be patterned by lithographic exposure and development. Alternatively, the etch mask layer 1017 may be patterned by other patterning methods.

In one embodiment, the pattern for the etch mask layer 1017 may be determined by measuring a two-dimensional deformation map of the first wafer (70W or 90W), and by calculating a target pattern for the etch mask layer 1017 as an output employing an automated program that employs the two-dimensional deformation map of the first wafer (70W or 90W) as an input. In an illustrative example, the warpage of the first wafer (70W or 90W) can be measured after depositing the stress-generating film 1010 on the backside of the first wafer (70W or 90W). An area in which warpage of the first wafer (70W or 90W) is below a predefined threshold may be assigned as the first area, and an area in which warpage of the first wafer (70W or 90W) is above the predefined threshold may be assigned as the second area. Various algorithms may be employed to shift the boundary between the first area and the second area. The algorithm may divide the area of the first wafer (70W or 90W) into multiple zones (such as 2-24 zones) having different levels, or types, of vertical deformation (deviation from a horizontal plane), and various algorithms may be employed to generate a map of the first area from which the etch mask layer 1017 is to be removed and the second area in which the etch mask layer 1017 is to remain.

Alternatively, multiple etch mask layers 1017 may be employed to pattern the stress-generating film 1010 into multiple areas (2-8 areas) having different thicknesses in addition to an area from which the stress-generating film 1010 is to be completely removed. In this case, multiple maps for patterning multiple etch mask layers 1017 can be generated employing an automated program that analyzes the two-dimensional deformation map of the first wafer (70W or 90W).

The target pattern for the etch mask layer 1017 may be replicated on the etch mask layer 1017 by lithographic exposure and development and/or by selective removal, for example, by a laser beam or targeted application of an etchant (such as a wet etch chemical applied in the form of a jet). Subsequently, the pattern in the etch mask layer 1017 is transferred into the stress-generating film 1010 employing an etch process that employs the etch mask layer 1017 as a blocking structure that prevents access of an etchant. A first portion of the stress-generating film 1010 is removed from the first area that is not masked by the etch mask layer 1017, while the second portion of the of the stress-generating film 1010 located within the second area that is masked by the etch mask layer 1017 is not removed. In one embodiment, the first portion of the stress-generating film 1010 can be removed by an isotropic etch process or an anisotropic etch process that etches the material of the stress-generating film 1010 selective to the material of the first wafer (70W or 90W). The etch mask layer 1017 may be removed prior to dicing the plurality of first semiconductor dies (700 or 900).

FIGS. 2A, 2B, 3A and 3B illustrate embodiments in which the stress-generating film 1010 is patterned to have multiple thicknesses. In such cases, the backside area of the first wafer (70W or 90W) can include a first area from which the stress-generating film 1010 is completely removed, a second area from which the stress-generating film 1010 is not removed so that a portion of the stress-generating film 1010 has an initial thickness t0 (i.e., the thickness of the as-deposited stress-generating film 1010), a third area in which the stress-generating film 1010 is only partially removed to provide a first intermediate thickness t1 for the stress-generating film 1010 that is less than the initial thickness t0 of the stress-generating film 1010. Additional intermediate thicknesses such as second intermediate thickness t2 may be present in the stress-generating film 1010. Generally, various portions of the stress-generating film 1010 can be fully or partially etched. In some embodiments, the stress-generating film 1010 can be partially etched from a third area over the backside of the first wafer (70W or 90W). In this case, a thinned portion of the stress-generating film 1010 is present in the third area after partially etching the stress-generating film 1010.

Generally, the first area, the second area, the optional third area, and any additional area in which the stress-generating film 1010 has a different thickness can have any arbitrary shape. In an illustrative example, the first area can have a shape of a block arc defined by a range of azimuthal angles between a first boundary azimuthal angle and a second boundary azimuthal angle about a geometrical center GC of the backside of the first wafer (70W or 90W) and a range of the radius between the radius of an inner arc and the radius of an outer arc as illustrated in FIGS. 2A and 2B. In another illustrative example, the first area can have a shape of a sector defined by a range of azimuthal angles between a first boundary azimuthal angle and a second boundary azimuthal angle about a geometrical center GC of the backside of the first wafer (70W or 90W) as illustrated in FIGS. 3A and 3B.

Referring to FIGS. 4A and 4B, the etch mask layer can comprise a photoresist layer, and the photoresist layer can be patterned by loading the first wafer (70W or 90W) upside down on a lithographic exposure tool, and by selectively lithographically exposing a first subset of exposure fields 420 that fit into the first wafer (70W or 90W) without exposing a second subset of exposure fields 420. In this case, the entire area of each exposure field 420 can be lithographically exposed at each lithographic exposure step. Thus, a reticle is not necessary in the lithographic tool. In other words, the exposure process can be a reticle-less exposure process in which the entire illumination is lithographically exposed without any pattern. In one embodiment, the photoresist layer can be subsequently removed from the first subset of exposure fields and not removed from the second subset of exposure fields upon development. In another embodiment, the photoresist layer can be subsequently removed from the second subset of exposure fields and not removed from the first subset of exposure fields upon development.

Referring to FIGS. 5A and 5B and according to an embodiment, a boundary between the first area (from which the stress-generating film 1010 is removed) and the second area (from which the stress-generating film 1010 is not removed) can have a variable distance r(θ) from a geometrical center GC of the backside of the first wafer (70W or 90W). The variable distance r(θ) can vary as a function of an azimuthal angle θ about the geometrical center GC of the backside of the first wafer (70W or 90W).

Once the deformation in the first wafer (70W or 90W) is eliminated or significantly reduced by formation and/or patterning of the stress-generating film 1010 on the backside of the first wafer (70W or 90W), a second wafer including a plurality of second semiconductor dies can be bonded to the first wafer (70W or 90W) while the patterned stress-generating film 1010 is present on the backside of the first wafer (70W or 90W). The presence of the patterned stress-generating film 1010 on the backside of the first wafer (70W or 90W) provides a flat bonding-side surface for the first wafer (70W or 90W), which can be the front side of the first wafer (70W or 90W).

In one embodiment, the second wafer may be flattened prior to bonding to reduce the deformation of the bonding surface of the second wafer from a two-dimensional plane. In this case, a stress-generating film 1010 can be deposited and patterned on the backside of the second wafer employing the same processing steps that are employed to flatten the first wafer (70W or 90W) as described above.

The patterned stress-generating film 1010 may remaining on the first wafer (70W or 90W) after bonding, or may be removed after bonding. The bonded assembly of the first wafer (70W or 90W) and the second wafer can be subsequently diced to provide bonded chips including a first die and a second die. Remaining portions of the stress-generating film 1010 on the bonded chips may, or may not, be removed.

In one embodiment, one of the first wafer (70W or 90W) and the second wafer includes a two-dimensional array of memory dies and another of the first wafer (70W or 90W) and the second wafer includes a two-dimensional array of support dies. In this case, bonded chips can be provided, each of which includes a memory die and a support die including a peripheral circuitry for operating a three-dimensional memory array in the memory die. In one embodiment, the plurality of first semiconductor dies in the first wafer 90W comprises a plurality of memory dies 900 including a respective instance of a three-dimensional array of memory elements, and the second semiconductor dies comprise a plurality of support dies 700 that including a respective peripheral circuitry configured to operate an instance of the three-dimensional array of memory elements.

Referring to FIG. 6A, a first semiconductor die 900 in a first wafer and a second semiconductor die 700 in a second wafer are illustrated after formation of metal pad structures (144, 788) therein according to a second embodiment of the present disclosure. Each first semiconductor die 900 can include first semiconductor devices 920, first metal interconnect structures 970, and first metal bonding pads 144 having first concave top surfaces. In one embodiment, each first semiconductor die 900 can be a memory die, and the first semiconductor devices 920 can include a three-dimensional array of memory elements such as a three-dimensional NAND array. For example, the three-dimensional array of memory elements can be embodied as a two-dimensional array of vertical NAND strings.

The first metal interconnect structures 970 can be embedded within interconnect-level dielectric layers of the first wafer. The first metal bonding pads 144 can be provided, for example, by forming pad-level recesses in a first pad-level dielectric layer 960 (which can be the topmost dielectric layer among the interconnect-level dielectric layers of the first semiconductor die 900) that overlies the first metal interconnect structures 970, depositing at least one metallic material such as copper in the pad-level recesses and over the first pad-level dielectric layer 960, and by removing portions of the at least one metallic material from above the horizontal plane including the top surface of the first pad-level dielectric layer 960 by chemical mechanical planarization (CMP). Collateral dishing of the at least one metallic material occurs over regions of the pad-level recesses. Remaining portions of the at least one metallic material in the pad-level recesses constitute the first metal bonding pads 144.

The lateral dimensions of the first metal bonding pads 144 may be in a range from 1 micron to 60 microns, and the top surfaces of the first metal bonding pads 144 can develop a concave profile due to dishing during the CMP process. Generally, the greater the lateral dimensions of the first metal bonding pads 144, the greater the degree of dishing during the CMP process and the degree of the resulting concave profile of the top surfaces of the first metal bonding pads 144. Generally, dishing during a CMP process occurs because a polishing pad bends slightly into metallic material portions relative to the physically exposed areas of the first pad-level dielectric layer 960 to remove the metal from within the pad-level recesses. The deviation in height of the top surface of each first metal bonding pad 144 due to dishing can be in a range from 3 nm to 300 nm depending on the width of the first metal bonding pads 144.

Each second semiconductor die 700 can include second semiconductor devices 720, second metal interconnect structures 770, and second metal bonding pads 788 having second concave top surfaces. In one embodiment, each second semiconductor die 700 can be a support die, and the second semiconductor devices 720 can include a peripheral circuitry for controlling operation of the three-dimensional array of memory elements provided in a first semiconductor die 900.

The second metal interconnect structures 770 can be embedded within interconnect-level dielectric layers of the second wafer. The second metal bonding pads 788 can be provided, for example, by forming pad-level recesses in a second pad-level dielectric layer 760 (which can be the topmost dielectric layer among the interconnect-level dielectric layers of the second semiconductor die 700) that overlies the second metal interconnect structures 770 (when the pad-side surface of the second semiconductor die 700 faces upward), depositing at least one metallic material such as copper in the pad-level recesses and over the second pad-level dielectric layer 760, and by removing portions of the at least one metallic material from above the horizontal plane including the top surface of the second pad-level dielectric layer 760 by chemical mechanical planarization (CMP). Collateral dishing of the at least one metallic material occurs over regions of the pad-level recesses. Remaining portions of the at least one metallic material in the pad-level recesses constitute the second metal bonding pads 788.

The lateral dimensions of the second metal bonding pads 788 may be in a range from 1 micron to 60 microns, and the top surfaces of the second metal bonding pads 788 can develop a concave profile due to dishing during the CMP process. The deviation in height of the top surface of each second metal bonding pad 788 due to dishing can be in a range from 3 nm to 300 nm depending on the width of the second metal bonding pads 788.

Figure 6B:
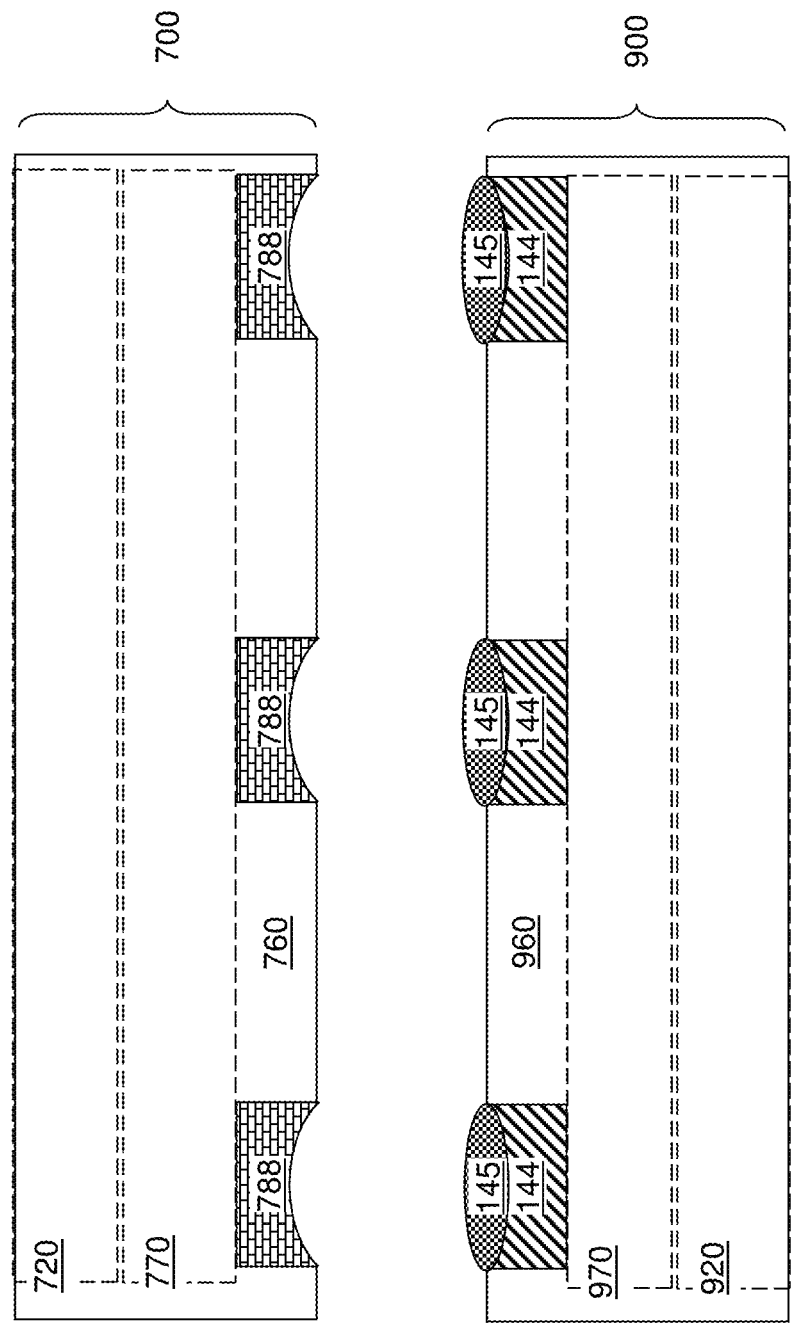
FIG. 6B is a vertical cross-sectional view of the first semiconductor die in the first wafer and the second semiconductor die in the second wafer after formation of metallic bump portions on the first wafer according to the second embodiment of the present disclosure.

Referring to FIG. 6B and according to an aspect of the present disclosure, metallic bump portions 145 are formed directly on the physically exposed surfaces of the first metallic bonding pads 144 by a selective metal deposition process. The metallic bump portions 145 can be grown from the first concave top surfaces of the first metal bonding pads 144 by selectively depositing a metallic material on the first concave top surfaces of the first metal bonding pads 144.

In one embodiment, the metallic bump portions 145 are formed by a selective metal chemical vapor deposition process that grows a metallic material of the metallic bump portions 145 from physically exposed metallic surfaces including the first concave top surfaces of the first metal bonding pads 144 while suppressing growth of the metallic material from dielectric surfaces such as the surfaces of the first pad-level dielectric layer 960. In this case, the metallic material of the metallic bump portions 145 can consists essentially of an elemental metal selected from cobalt, ruthenium, and molybdenum.

In another embodiment, metallic bump portions 145 are formed by an electroless plating or electroplating process that grows a metallic material of the metallic bump portions 145 from physically exposed metallic surfaces including the first concave top surfaces of the first metal bonding pads 144 while suppressing growth of the metallic material from dielectric surfaces such as the surfaces of the first pad-level dielectric layer 960. In this case, the metallic material of the metallic bump portions 145 can consists essentially of at least one electroless platable or electroplatable metal such as cobalt, gold, silver, copper, nickel, tin, a tin-lead alloy, brass, cadmium, palladium, zinc, a cobalt-tungsten-phosphorus alloy, or a combination or alloy thereof. In one embodiment, the metallic bump portions 145 can have a greater thickness at a center portion than at an edge portion. For example, a superfill process for electroplating may be employed to provide a greater thickness for the center regions of the metallic bump portions 145 than the edge regions of the metallic bump portion 145.

In some embodiments, the first metal bonding pads 144 and the second metal bonding pads 788 can comprise, and/or consist essentially of, copper, and the metallic bump portions 145 comprise, and/or consist essentially of, a metallic material that is different from copper, such as cobalt. The size of the metallic material(s) in the metallic bump portion 145 can be selected such that each metallic bump portion 145 has a volume that is the same as, or greater than, a pair of recess volumes for a matching pair of a first metal bonding pad 144 and a second metal bonding pad 788 to be subsequently bonded with the metallic bump portion 145 therebetween.

Figure 6C:
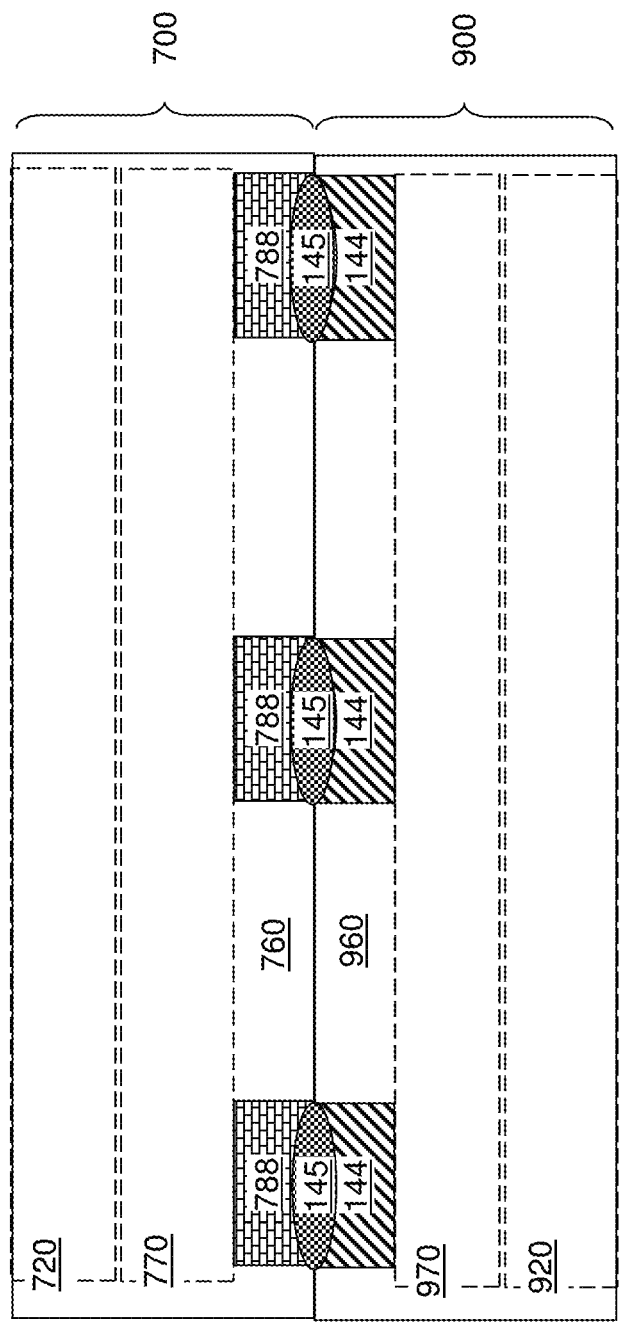
FIG. 6C is a vertical cross-sectional view of the first semiconductor die in the first wafer and the second semiconductor die in the second wafer after bonding the second wafer to the first wafer according to the second embodiment of the present disclosure.

Referring to FIG. 6C, the first wafer and the second wafer can be bonded by wafer-to-wafer bonding such that each metallic bump portion 145 is disposed between a matching pair of a first metal bonding pad 144 and a second metal bonding pad 788. Each first semiconductor die 900 in the first wafer can be bonded to a corresponding second semiconductor die 700 in the second wafer through the bonding process. In one embodiment, each second semiconductor die 700 can be bonded to a respective first semiconductor die 900 by bonding the second metal bonding pads 788 to the metallic bump portions 145 via metal-to-metal bonding. A suitable anneal process can be performed to induce metal-to-metal bonding between the second metal bonding pads 788 to the metallic bump portions 145.

In one embodiment, the material of the metallic bump portions 145 can have higher malleability than the material of the first metal bonding pads 144 and the material of the second metal bonding pads 788. In this case, the metallic bump portions 145 can deform to conform to the shape of the concave surfaces of the second metal bonding pads 144 prior to metal-to-metal bonding, thereby providing a greater bonding strength. The metal bump portions 145 are self-aligned to the first metal bonding pads 144, and suppresses or reduces void formation at the bonding interface between the first semiconductor die 900 and the second semiconductor die 700, thereby increasing the strength of bonding between the first semiconductor die 900 and the second semiconductor die 700.

Figure 7:
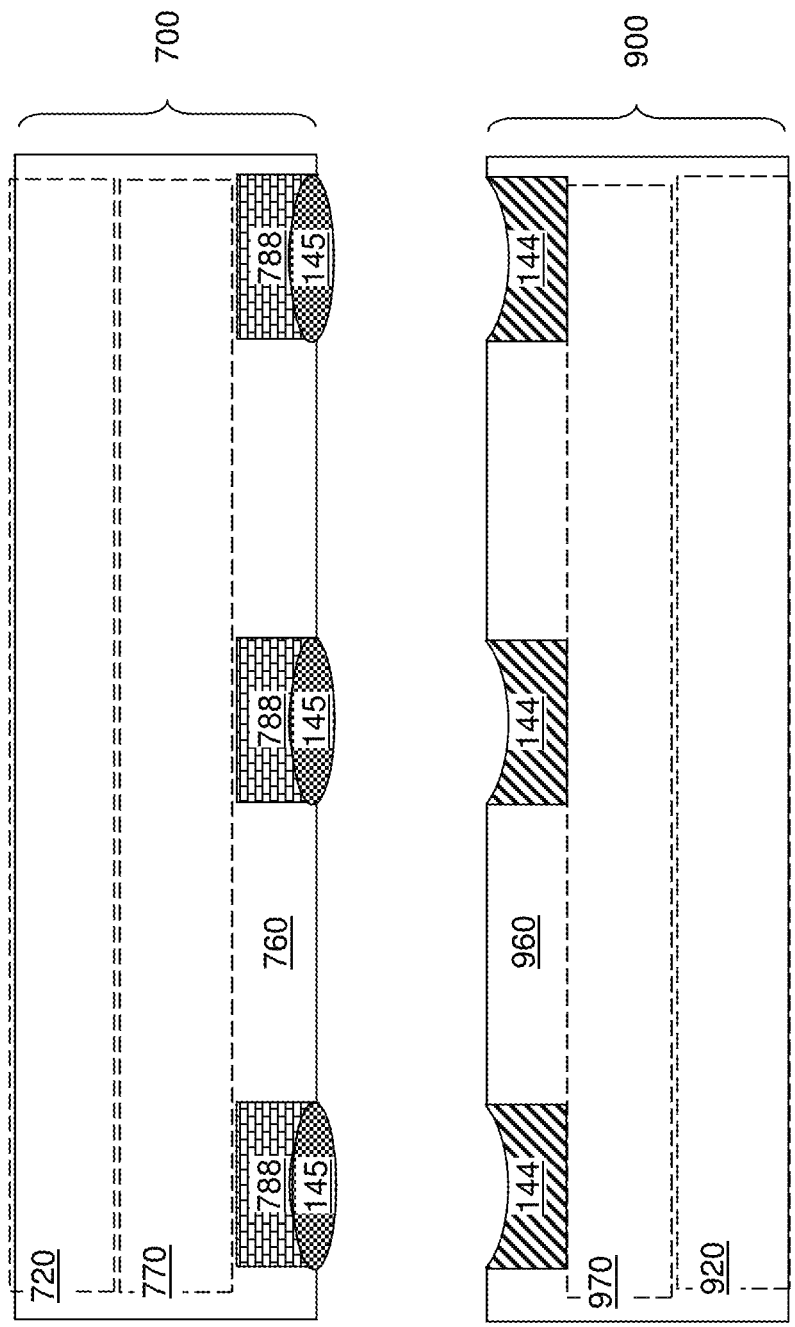
FIG. 7 is a vertical cross-sectional view of the first semiconductor die in the first wafer and the second semiconductor die in the second wafer after formation of metallic bump portions on the second wafer according to the second embodiment of the present disclosure.

Referring to FIG. 7, alternative embodiment is illustrated at the processing steps of FIG. 6B. In this case, the metal bump portions 145 are grown from the second metal bonding pads 788 by a selective metal deposition process. The processing steps of FIG. 6B can be performed on the second wafer including the second semiconductor dies 700. Subsequently, the processing steps of FIG. 6C can be performed to provide the structure illustrated in FIG. 6C.

Figure 8B:
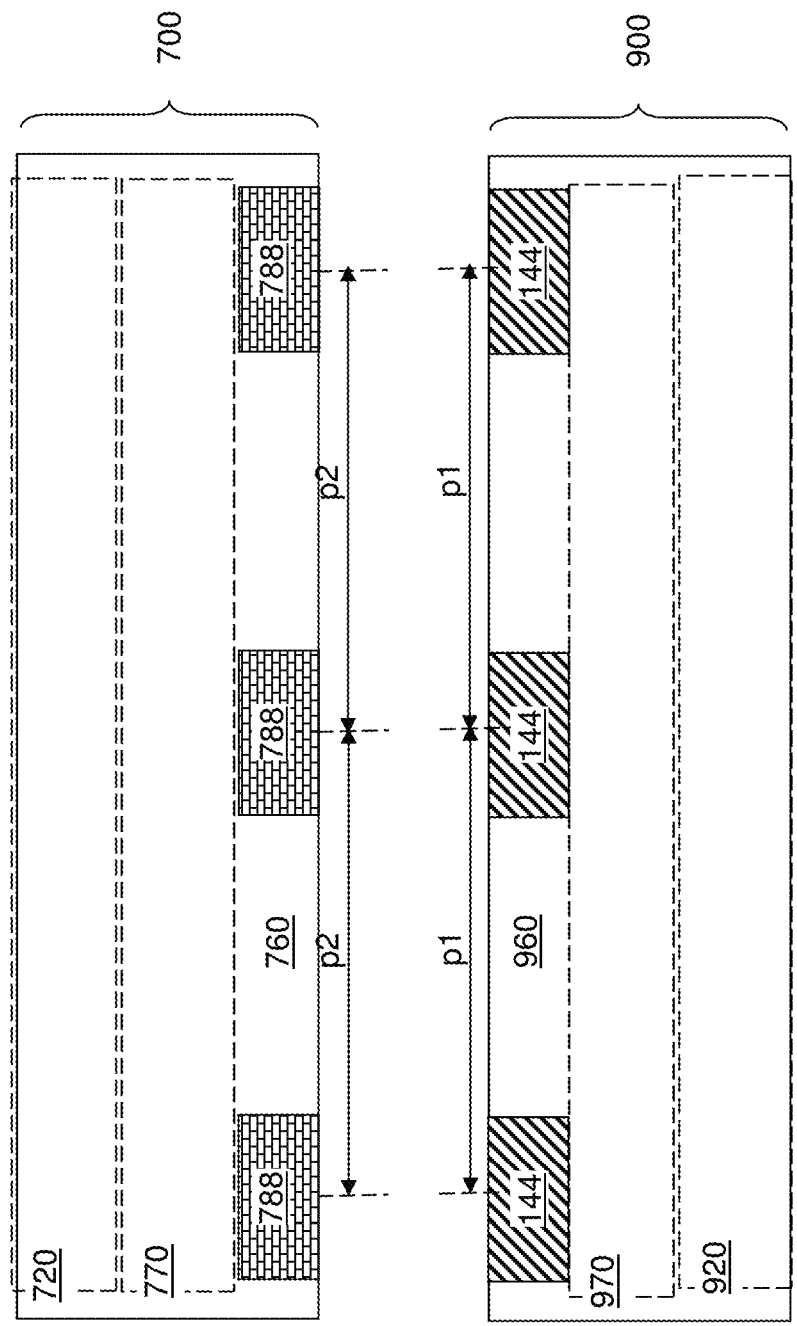
FIG. 8B is a vertical cross-sectional view of a memory die in a first exemplary wafer and a support die in the second exemplary wafer of FIG. 8A after formation of metallic pads on the second exemplary wafer according to the second embodiment of the present disclosure.

Referring to FIGS. 8A and 8B, a first configuration for implementing a third embodiment of the present disclosure is illustrated. FIG. 8A illustrates a second wafer 70W during lithographic exposure of a photoresist layer 707 that is employed to generate a pattern for the second metal bonding pads 788. FIG. 8B illustrates a firs semiconductor die 900 in the first wafer and a second semiconductor die 700 in the second wafer after formation of the first metal bonding pads 144 and the second metal bonding pads 788. The first metal bonding pads 144 can be formed with a first pad-to-pad pitch p1 prior to the lithographic patterning step illustrated in FIG. 8A, and the second metal bonding pads 788 can be formed with a second pad-to-pad pitch p2 employing the lithographic patterning step illustrated in FIG. 8A, which employs a lithographic pitch adjustment process to be described below so that the second pad-to-pad pitch p2 matches the first pad-to-pad pitch p1.

Referring to FIG. 8B, a first wafer including first semiconductor dies 900 is provided. Each first semiconductor die 900 can include first semiconductor devices 920, first metal interconnect structures 970, and first metal bonding pads 144 having first concave top surfaces. In one embodiment, each first semiconductor die 900 can be a memory die, and the first semiconductor devices 920 can include a three-dimensional array of memory elements such as a three-dimensional NAND array. For example, the three-dimensional array of memory elements can be embodied as a two-dimensional array of vertical NAND strings.

The first metal interconnect structures 970 can be embedded within interconnect-level dielectric layers of the first wafer. The first metal bonding pads 144 are embedded in a first pad-level dielectric layer 960 (which can be the topmost dielectric layer among the interconnect-level dielectric layers of the first semiconductor die 900), and overlie, and are electrically connected to, the first metal interconnect structures 970. The lateral dimensions of the first metal bonding pads 144 may be in a range from 1 micron to 60 microns, although lesser and greater dimensions can also be employed. The first metal bonding pads 144 may be formed as a one-dimensional periodic array or as a two-dimensional periodic array. In one embodiment, the first metal bonding pads 144 can have a periodic pitch along a horizontal direction, which is herein referred to as a first pad-to-pad pitch p1.

A second wafer 70W including second semiconductor dies 700 is provided. Each second semiconductor die 700 can include second semiconductor devices 720, second metal interconnect structures 770, and second metal bonding pads 788 having second concave top surfaces. In one embodiment, each second semiconductor die 700 can be a support die, and the second semiconductor devices 720 can include a peripheral circuitry for controlling operation of the three-dimensional array of memory elements provided in a first semiconductor die 900. After formation of the second semiconductor devices 720, second metal interconnect structures 770 embedded within interconnect-level dielectric layers are formed over the second semiconductor devices 720. A topmost layer of the interconnect-level dielectric layers of the second wafer 70W comprises a second pad-level dielectric layer 760. In one embodiment, the second pad-level dielectric layer 760 can have the same thickness as the thickness of the second metal bonding pads 788.

Referring to FIG. 8A, the second metal bonding pads 788 can be formed by applying a photoresist layer 707 over the top surface of the second pad-level dielectric layer 760 of the second wafer 70W prior to a lithographic exposure process. The second metal interconnect structures 770 are embedded in the interconnect-level dielectric layers of the second wafer 70W. During a lithographic exposure process, the pattern of the second metal bonding pads 788 is lithographically generated in the photoresist layer 707 by lithographically exposing the photoresist layer 707 in a lithographic exposure tool. The lithographic exposure tool includes an illumination source (not shown), a reticle 830 including the pattern for the second metal bonding pads 788 to be subsequently formed, and a lens 850 that is configured to generate a focused image on the photoresist layer 707.

The lithographic pattern for the second metal bonding pads 788 can include a one-dimensional periodic array of pad shapes and/or a two-dimensional periodic array of pad shapes. In one embodiment, the lithographic pattern for the second metal bonding pads 788 can have a periodic pitch along a horizontal direction that is intended to match the nominal value (target value) for the first pad-to-pad pitch p1 of the first semiconductor dies 900.

Prior to lithographic exposure of the photoresist layer 707 in the exposure tool, the first wafer is processed through the step for manufacturing the first metal bonding pads 144. The first pad-to-pad pitch p1 of the first semiconductor dies 900 in the first wafer is measured employing a metrology tool, and is compared with the nominal pad-to-pad pitch for the second metal bonding pads 788 to be subsequently formed. The measured pad-to-pad pitch p1 is the average of the center-to-center distances between neighboring pairs of first metal bonding pads 144 along a horizontal direction. The nominal pad-to-pad pitch for the second metal bonding pads 788 can be the same as the nominal pad-to-pad pitch for the first metal bonding pads 144, which is the target value for the first pad-to-pad pitch p1. Generally, the measured first pad-to-pad pitch p1 is different from the pad-to-pad pitch for the first metal bonding pads 144 due to wafer deformation induced by stress-inducing components within the first wafer. For example, metallic material portions in the first semiconductor dies 900 can include wafer deformation in the first wafer at the time of formation of the first metal bonding pads 144. In some cases, existing deformation of the first wafer at the time of formation of the first metal bonding pads 144 may make it impossible to form the first metal bonding pads 144 with the nominal pad-to-pad pitch for the first metal bonding pads 144. In such cases, the first pad-to-pad pitch p1 of the first wafer may be different from the nominal pad-to-pad pitch for the first metal bonding pads 144.

Generally, the reticle 830 is designed to lithographically print the pattern for the second metal bonding pads 788 at the nominal pad-to-pad pitch for the second metal bonding pads 788, which can be the same as the pad-to-pad pitch for the first metal bonding pads 144. According to an aspect of the present disclosure, the photoresist layer 707 can be lithographically exposed with a lithographic pattern for second metal bonding pads 788 with a modified pad-to-pad pitch (that is different from the nominal pad-to-pad pitch) that matches the measured values of the first pad-to-pad pitch p1 on the first wafer. To adjust the scale of the lithographic image to be formed in the photoresist layer 797, a tilt-shift operation can be performed on the lens 850.

During the tilt-shift operation, a center axis CA of the lens 850 is tilted with respect to a light propagation axis LPA of the exposure tool by a non-zero tilt angle $\alpha$, and a geometrical center CL of the lens 850 is laterally offset from the light propagation axis LPA of the exposure tool. The tilt angle $\alpha$ of the lens 850 and the displacement of the geometrical center CL of the lens 850 from the light propagation axis LPA are selected such that image distortion caused by the tilt angle $\alpha$ of the lens 850 is cancelled by the displacement of the geometrical center CL of the lens 850 from the light propagation axis LPA to first order, and the first order effect of the combination of the titling of the lens 850 and the lateral shift of the lens (i.e., the tilt-shift operation) is net magnification or net reduction of the image of the reticle at the plane of exposure, i.e., at the photoresist layer 707. The tilt angle $\alpha$ of the lens 850 and the displacement of the geometrical center CL of the lens 850 from the light propagation axis LPA can be adjusted such that the average pitch of the pattern for the second metal bonding pads 788 that is transferred into the photoresist layer 707 through lithographic exposure is the same as the measured first pad-to-pad pitch p1 of the first wafer. The average pitch of the pattern for the second metal bonding pads 788 transferred into the photoresist layer 707 during the lithographic exposure step employing the tilt-shift operation is herein referred to as a second pad-to-pad pitch p2.

In one embodiment, the second pad-to-pad pitch p2 can be less than, or greater than, the nominal pad-to-pad pitch for the second metal bonding pads 788. The nominal pad-to-pad pitch for the second metal bonding pads 788 is the pad-to-pad pitch within a lithographic image that is generated in the exposure tool under a nominal condition of a zero tilt angle for the lens 850 and a zero lateral offset for the geometrical center of the lens 850.

The photoresist layer 707 can be developed to provide a developed photoresist layer after the lithographic exposure process. Lithographically exposed regions of the photoresist layer 707 or lithographically unexposed regions of the photoresist layer 707 may be removed depending on the polarity of the photoresist layer. The pattern in the developed photoresist layer can be transferred to replicate the pattern for the second metal bonding pads 788 in a material layer that is located on the second semiconductor dies 700 and underlies the developed photoresist layer. For example, the pattern in the developed photoresist layer 707 can be transferred through the second pad-level dielectric layer 760 by an etch process such as an anisotropic etch process, thereby forming pad-level recesses. The photoresist layer 707 is subsequently removed, for example, by ashing. At least one metallic material can be deposited in the pad-level recesses, and planarization process can be performed to form the second metal bonding pads 788. The second metal bonding pads 788 have the second pad-to-pad pitch p2.

Thus, the second metal bonding pads 788 can be formed on the second metal interconnect structures 770 with the second pad-to-pad pitch p2 employing a lithographic exposure process in which a tilt-shift operation is performed on the lens 850 of an exposure tool. The lithographic process defines a pattern for the second metal bonding pads 788 such that the second pad-to-pad pitch p2 matches the measured first pad-to-pad pitch of the first wafer.

Figure 9A:
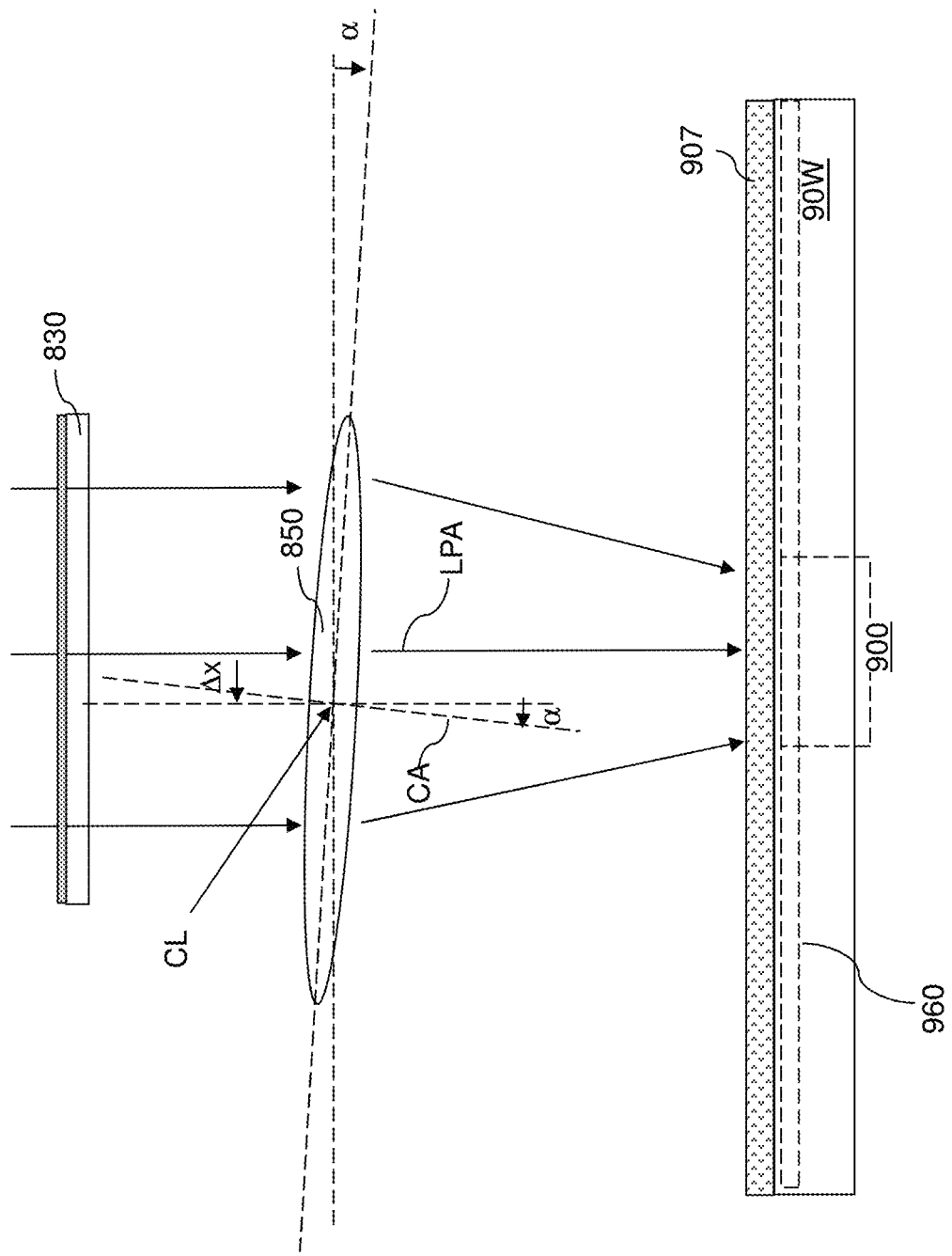
FIG. 9A is a vertical cross-sectional view of a second exemplary wafer including memory dies during lithographic exposure in an exposure tool employing a tilt-shift operation according to the third embodiment of the present disclosure.
Figure 9B:
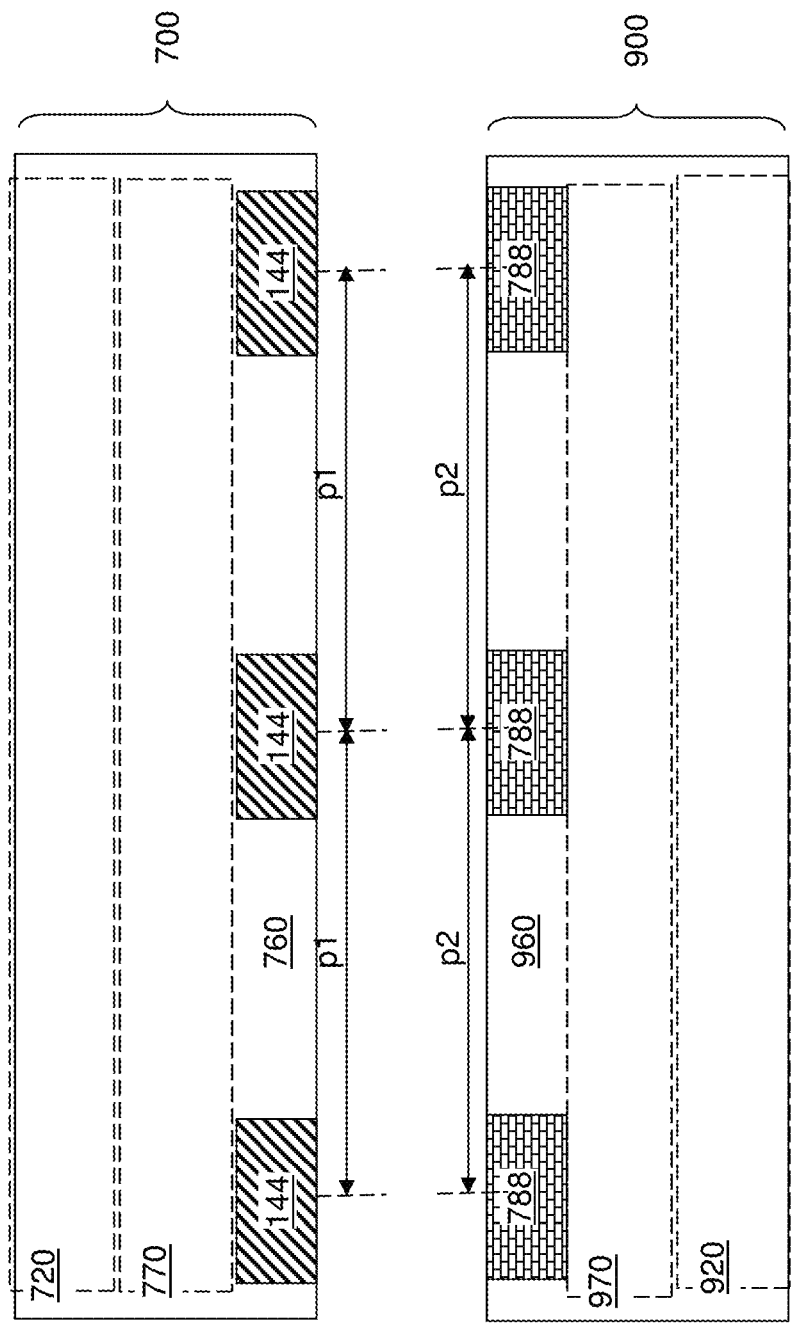
FIG. 9B is a vertical cross-sectional view of a support die in a first exemplary wafer and a memory die in the second exemplary wafer of FIG. 9A after formation of metallic pads on the second exemplary wafer according to the second embodiment of the present disclosure.

Referring to FIGS. 9A and 9B, a second for implementing the third embodiment of the present disclosure is illustrated. FIG. 9A illustrates a first wafer 90W during lithographic exposure of a photoresist layer 907 that is employed to generate a pattern for the first metal bonding pads 144. FIG. 9B illustrates a firs semiconductor die 900 in the first wafer 90W and a second semiconductor die 700 in the second wafer after formation of the first metal bonding pads 144 and the second metal bonding pads 788. The second metal bonding pads 788 can be formed with a first pad-to-pad pitch p1 prior to the lithographic patterning step illustrated in FIG. 9A, and the first metal bonding pads 144 can be formed with a second pad-to-pad pitch p2 employing the lithographic patterning step illustrated in FIG. 9A, which employs a lithographic pitch adjustment process described above so that the second pad-to-pad pitch p2 matches the first pad-to-pad pitch p1. In the second configuration, the second metal bonding pads 788 are formed first, and the pitch of the second metal bonding pads 788 are measured, which is herein referred to as a first pad-to-pad pitch p1. A lithographic exposure process is performed with the tilt-shift process described above such that the lithographic pattern in the photoresist layer 907 is formed with a second pad-to-pad pitch p2, which may be different from the nominal pad-to-pad pitch for the first metal bonding pads 144 and the second metal bonding pads 788. The second pad-to-pad pitch p2 is selected to match the first pad-to-pad pitch p1. Subsequently, processing steps for forming the second metal bonding pads 788 are performed to provide the second metal bonding pads 788 having the second pad-to-pad pitch p2 that matches the first pad-to-pad pitch p1.

Referring to FIGS. 8B and 9B, the first wafer and the second wafer are formed with the same pad-to-pad pitch, i.e., such that the second pad-to-pad pitch p2 is the same as the first pad-to-pad pitch p1. The first wafer and the second wafer can be subsequently bonded with a greater bonding strength because the areas of the second metal bonding pads 788 overlap with the areas of the first metal bonding pads 144.

Figure 10A:
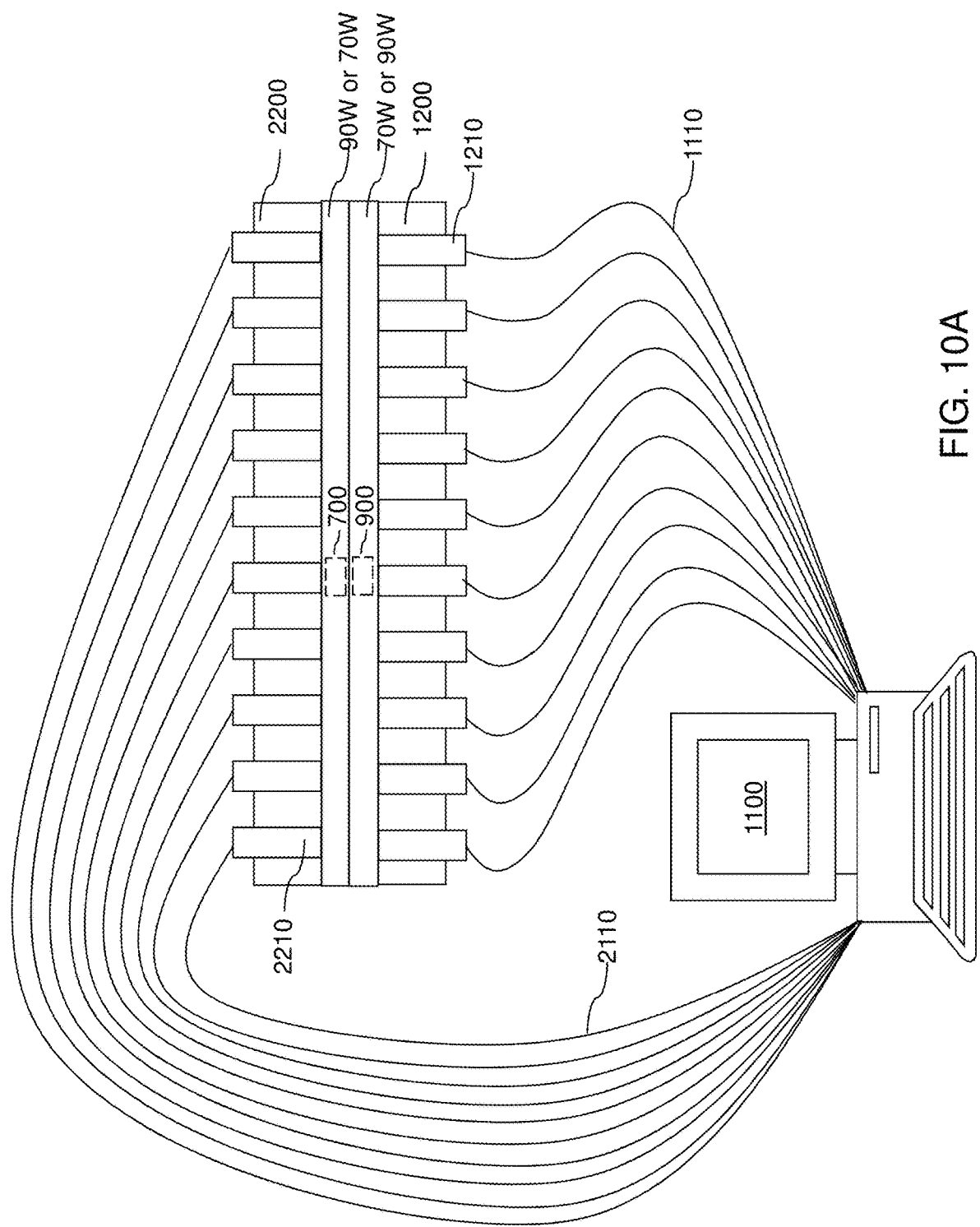
FIG. 10A is a schematic view of an exemplary wafer bonding apparatus including a computer, a first chuck, a second chuck, and a stack of a first wafer and a second wafer disposed between the first chuck and the second chuck during bonding according to a fourth embodiment of the present disclosure.
Figure 10B:
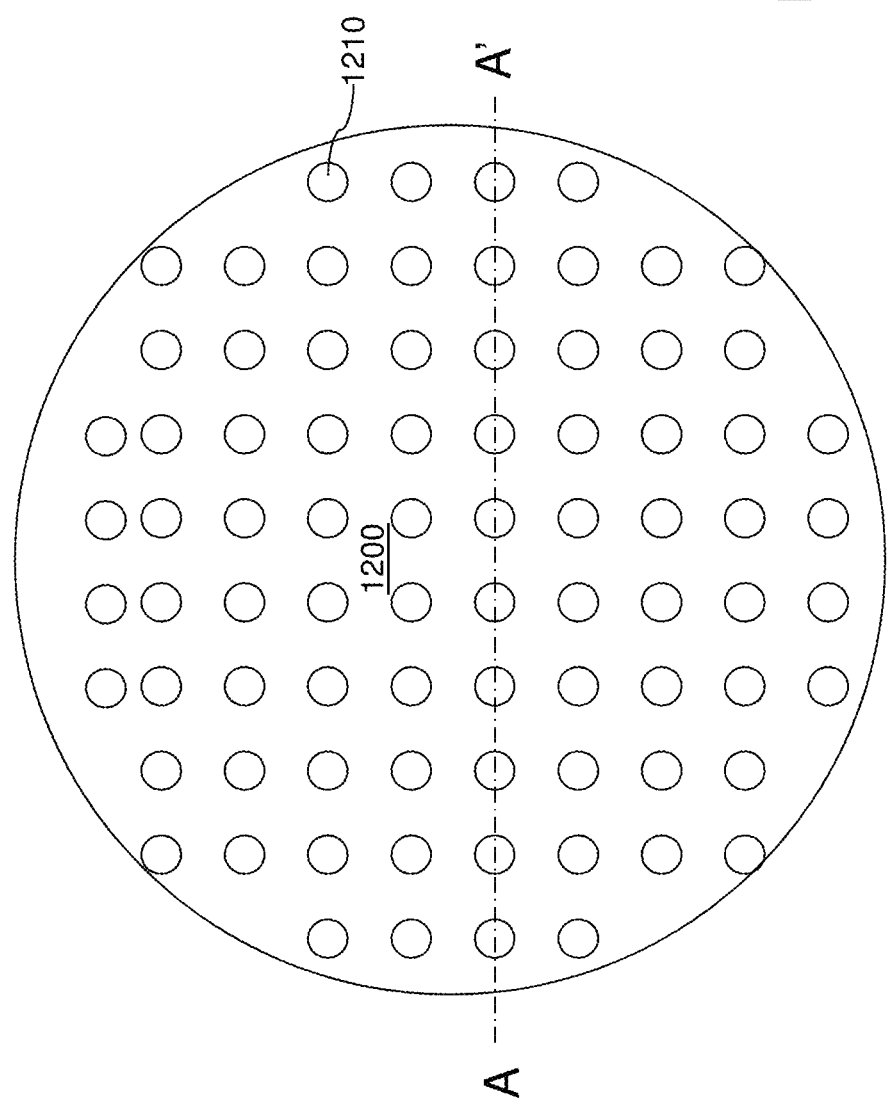
FIG. 10B is top-down view of a first configuration of the first chuck or the second chuck in the exemplary wafer bonding apparatus of FIG. 10A. The vertical cross-sectional plane A-A' corresponds to the plane of the vertical cross-sectional view for the first chuck and the second chuck illustrated in FIG. 10A.
Figure 11:
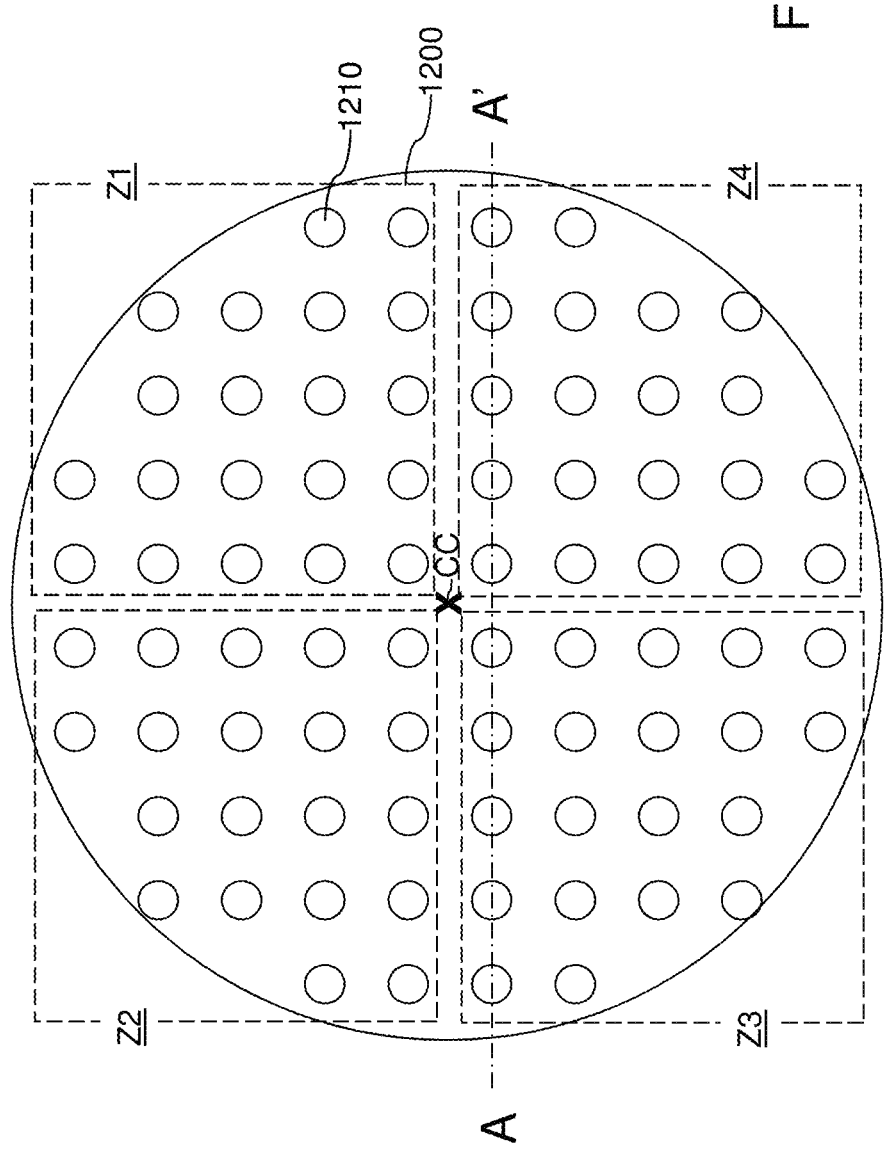
FIG. 11 is a top-down view of a second configuration of the first chuck or the second chuck in the exemplary wafer bonding apparatus of FIG. 10A. The vertical cross-sectional plane A-A' corresponds to the plane of the vertical cross-sectional view for the first chuck and the second chuck illustrated in FIG. 10A.
Figure 12:
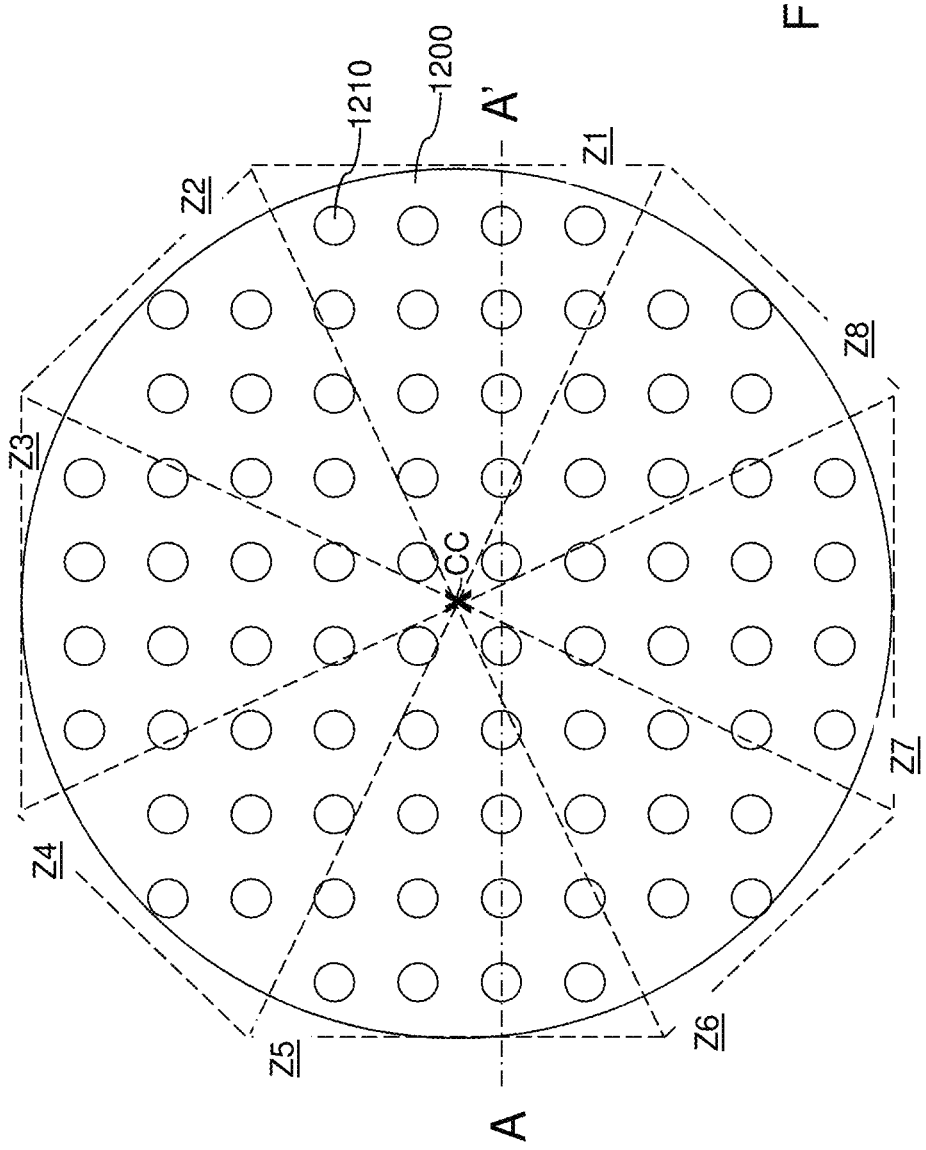
FIG. 12 is a top-down view of a third configuration of the first chuck or the second chuck in the exemplary wafer bonding apparatus of FIG. 10A. The vertical cross-sectional plane A-A' corresponds to the plane of the vertical cross-sectional view for the first chuck and the second chuck illustrated in FIG. 10A.
Figure 13:
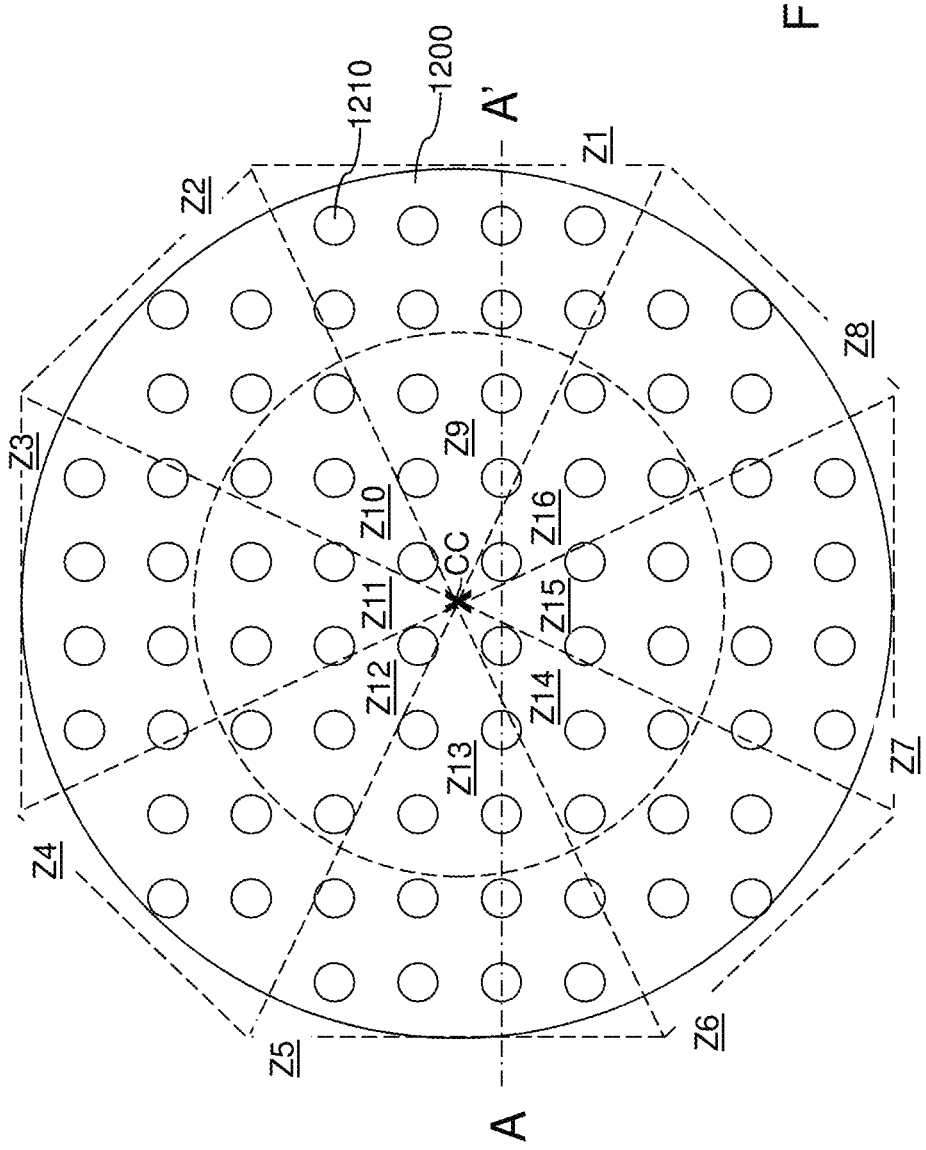
FIG. 13 is a top-down view of a second configuration of the first chuck or the second chuck in the exemplary wafer bonding apparatus of FIG. 10A. The vertical cross-sectional plane A-A' corresponds to the plane of the vertical cross-sectional view for the first chuck and the second chuck illustrated in FIG. 10A.

Referring to FIGS. 10A, 10B, 11, 12, and 13, various configurations are illustrated for an exemplary wafer bonding apparatus. FIG. 10A is a combination of a vertical cross-sectional view of a first chuck (1200, 1210), a second chuck (2200, 2210), and a stack of a first wafer 90W and a second wafer 70W disposed between the first chuck (1200, 1210) and the second chuck (2200, 2210), and a schematic view illustrating a computer 1100 and various signal wires (1110, 2110) that are employed to control pins (1210, 2210) located in the first chuck (1200, 1210) and the second chuck (2200, 2210) and configured to move vertically through a respective chuck. FIG. 10B is top-down view of a first configuration of the first chuck (1200, 1210) or the second chuck (2200, 2210). FIG. 11 is top-down view of a second configuration of the first chuck (1200, 1210) or the second chuck (2200, 2210). FIG. 12 is top-down view of a third configuration of the first chuck (1200, 1210) or the second chuck (2200, 2210). FIG. 13 is top-down view of a fourth configuration of the first chuck (1200, 1210) or the second chuck (2200, 2210).

The bonding apparatus illustrated in FIGS. 10A, 10B, 11, 12, and 13 are configured to bond a first wafer 90W and a second wafer 70W at a non-planar bonding interface or a planar bonding interface. As used herein, a planar bonding interface refers to a bonding interface that is located entirely within a two-dimensional Euclidean plane, and a non-planar bonding interface refers to a bonding interface that includes a two-dimensional manifold that does not fit within a two-dimensional Euclidean plane. In one embodiment, the deformation of the first wafer 90W and the second wafer 70W may be at a level that allows flattening of the first wafer 90W and the second wafer 70 to provide a planar bonding interface without cracking the first wafer 90W or the second wafer 70W. In this case, the bonding apparatus illustrated in FIGS. 10A, 10B, 11, 12, and 13 can be employed to bond the first wafer 90W and the second wafer 70W at a planar bonding interface. In another embodiment, the deformation of the first wafer 90W and the second wafer 70W may be at a level that does not allow flattening of the first wafer 90W and the second wafer 70 to provide a planar bonding interface without cracking the first wafer 90W or the second wafer 70W. In this case, the bonding apparatus illustrated in FIGS. 10A, 10B, 11, 12, and 13 can be employed to bond the first wafer 90W and the second wafer 70W at a non-planar bonding interface.

The wafer bonding apparatus of FIGS. 10A, 10B, 11, 12, and 13 can include a first chuck (1200, 1210) and a computer 1110. The first chuck (1200, 1210) comprises a first perforated platen 1200 that includes an array of first openings therethrough and a first planar surface, and first pins 1210 configured to move through the array of first openings and to contact a backside surface of a first wafer 90W that is disposed on the first planar surface. The computer includes a processor and a memory in communication with the processor, and is configured to control vertical movement of the first pins 1210.

Each of the first pins 1210 may include a respective vertical movement mechanism. In an illustrative example, each first pin 1210 may include a stationary section that includes a combination of a motor and a threaded shaft, and a mobile section including a slider element that vertically extends through a respective opening in the first perforated platen 1200. Each slider element may have a groove portion to prevent rotation of the slider element inside a respective opening in the first perforated platen 1200.

In the first configuration illustrated in FIG. 10B, each of the first pins 1210 may be configured to move independently through a respective opening in the first perforated platen 1200. In this case, the computer 1100 may be configured to independently control each of the first pins 1210, and to set the height of the top surface of each first pin 1210 at a respective target height that is independent among one another.

In other configurations, a plurality of groups of first pins 1210 can be configured to move through the array of first openings and to contact a backside surface of a first wafer 90W. In one embodiment, the computer 1100 may be configured to independently control vertical movement of each group of the first pins 1210. In one embodiment, each group of first pins 1210 among the plurality of groups of first pins 1210 comprises a respective set of first pins 1210 that are configured to vertically move by a same vertical displacement distance. Different groups of first pins 1210 can be independently controlled to provide independent vertical displacement distances among the different groups.

In some configurations, the plurality of groups of first pins 1210 are spaced apart within the first chuck (1200, 1210) by being located within different azimuthal ranges about a geometrical center CC of the first chuck (1200, 1210) as illustrated in FIGS. 11, 12, and 13, and/or by being located within different radial distance ranges from the geometrical center CC of the first chuck (1200, 1210) as illustrated in FIG. 13. FIGS. 11, 12, and 13 illustrate various pin height control zones. For example, FIG. 11 illustrates a configuration including four pin height control zones Z1-Z4. FIG. 12 illustrates a configuration including eight pin height control zones Z1-Z8. FIG. 13 illustrates a configuration including sixteen pin height control zones Z1-Z16. All first pins 1210 within the same pin height control zone can move simultaneously to the same height to provide controlled deformation of the first wafer 90W. While FIGS. 11, 12, and 13 illustrate only three exemplary configurations for pin height control zones, any type of pin height control zones may be employed provided at least two different pin control zones are provided. Each pin height control zone includes at least one first pin 1210, and may include a plurality of first pins 1210. The total number of pin height control zones is less than the total number of the first pins 1210. For example, the total number of pin height control zones can be in a range from 2 to 360, such as from 4 to 24. The total number of the first pins 1210 may be in a range from 4 to 1,440, such as from 24 to 360. When the total number of the pin height control zones equals the total number of the first pins 1210, the configuration illustrated in FIG. 10B is provided.

In one embodiment, the computer 1100 can be loaded with an automated program for measuring vertical deviation of the backside surface of the first wafer 90W from the first planar surface of the first perforated platen 1200. In this case, the first wafer 90W can be disposed on the first planar surface of the first perforated platen 1200. The vertical deviation of the backside surface of the first wafer 90W from the first planar surface of the first perforated platen 1200 can be measured by vertically moving the first pins 1210 until each of the first pins 1210 contacts the backside surface of the first wafer 90W. The tip of each first pin 1210 may be provided with a contact sensor that generates an electrical signal upon contact with the backside of the first wafer 90W. The vertical displacement of the first pins 1210 at a position of an initial contact with the backside surface of the first wafer 90W is proportional to, and may be the same as, the local vertical deviation of the backside surface of the first wafer 90W from the first planar surface of the first perforated platen 1200.

In one embodiment, the wafer bonding apparatus comprises a second chuck (2200, 2210) overlying the first chuck (1200, 1210) and is configured to press against a stack of the first wafer 90W and a second wafer 70W located upon the first chuck (1200, 1210). The second chuck (2200, 2210) comprises a second perforated platen 2200 that includes an array of second openings therethrough and a second planar surface that face the first planar surface of the first chuck (1200, 1210), and second pins 2210 configured to move through the array of second openings and to contact a backside surface of the second wafer 70W that is disposed on the first wafer 90W. The computer can be configured to control vertical movement of the second pins 2210.

Each of the second pins 2210 may include a respective vertical movement mechanism. In an illustrative example, each second pin 2210 may include a stationary section that includes a combination of a motor and a threaded shaft, and a mobile section including a slider element that vertically extends through a respective opening in the second perforated platen 2200. Each slider element may have a groove portion to prevent rotation of the slider element inside a respective opening in the second perforated platen 2200.

The second pins 2210 may be configured to move independently through a respective opening in the second perforated platen 2200 in the same manner as the independently-controlled first pins 1210 illustrated in FIG. 10B. In this case, the computer 1100 may be configured to independently control each of the second pins 2210, and to set the height of the bottom surface of each second pin 2210 (that contact the backside surface of the second wafer 70W) at a respective target height that is independent among one another. In other configurations, a plurality of groups of second pins 2210 can be configured to move through the array of second openings and to contact a backside surface of the second wafer 70W. Generally, any of the configurations for the pin height control zones for the first pins 1210 may be employed for the configuration for the pin height control zones for the second pins 2210. In one embodiment, the configuration for the pin height control zones for the second pins 2210 may be a mirror image configuration for the pin height control zones for the first pins 1210. In one embodiment, each of the first pins 1210 and each of the second pins 2210 may be independently controlled.

In one embodiment, at least one heater for heating the stack of the first wafer 90W and the second wafer 70 can be located in, or on, at least one of the first chuck (1200, 1210) and the second chuck (2200, 2210). For example, a heater may be embedded in the first perforated platen 1200, and/or a heater may be embedded in the second perforated platen 2200. The heater(s) embedded in the first perforated platen 1200 and/or the second perforated platen 2200 can be employed to heat the stack of the first wafer 90W and the second wafer 70W while the bonding-side surface including the first metal bonding pads (such as the first metal bonding pads 144 illustrated in FIGS. 8B and 9B) contacts the bonding-side surface including the second metal bonding pads (such as the second metal bonding pads 788 illustrated in FIGS. 8B and 9B).

The bonding apparatus of FIGS. 10A, 10B, 11, 12, and 13 can be employed to form a semiconductor structure, which can include a bonded assembly of a first wafer 90W and a second wafer 70W. A plurality of first semiconductor dies 900 can be formed on a first wafer 90W. The first wafer 90W has a non-planar backside surface due to stress generated by the plurality of first semiconductor dies 900, which may be a memory die or a support die. The first wafer 90W can be disposed on a first chuck (1200, 1210). The first chuck (1200, 1210) includes a plurality of first pins 1210 configured to provide a local vertical displacement of the non-planar backside surface of the first wafer 90W from a planar top surface of the first chuck (1200, 1210).

Non-uniform vertical displacement can be provided to the first pins 1210 to provide structural support to the first wafer 90W. In one embodiment, a profile of the non-uniform vertical displacement can be selected such that the non-planar backside surface of the first wafer 90W is deformed from a profile of the non-planar backside surface upon placement on the first chuck (1200, 1210). In this case, non-uniform force profile is employed on the backside of the first wafer 90W to provide additional deformation of the first wafer 90W and to provide a surface profile to the bonding surface of the first wafer 90W that is more conducive to metal-to-metal bonding with a second wafer 70W. The profile of the non-uniform vertical displacement of the first pins 1210 can be selected based on measurement data on the deformation of the first wafer. For example, the profile of the non-uniform vertical displacement of the first pins 1210 can be selected based measurement of vertical displacement of the non-planar backside surface of the first wafer 90W from a planar top surface of a first perforated platen 1200.

In one embodiment, vertical deviation of the non-planar backside surface of the first wafer 90W from a planar horizontal surface (such as the planar top surface of the first perforated platen 1200) can be measured prior to providing structural support to the first wafer 90W. The non-uniform vertical displacement of the first pins 1210 while providing structural support to the first wafer 90W can be proportional to the local vertical deviation of the non-planar backside surface of the first wafer 90W from the planar horizontal surface around a respective one of the first pins 1210 as measured, for example, by moving the first pins 1210 until the first pins make contact with the backside surface of the first wafer 90W. In one embodiment, the first pins 1210 may be provided with a contact sensor that detects physical contact with the first wafer 90W.

In one embodiment, the non-uniform vertical displacement of the first pins 1210 may be less than the local vertical deviation of the non-planar backside surface of the first wafer 90W from the planar horizontal surface (such as the planar top surface of the first perforated platen 1200). In this case, the non-uniform vertical displacement of the first pins 1210 can provide a partially flattening profile to the first wafer 90W. In one embodiment, the non-uniform vertical displacement of the first pins 1210 can be within a range from 25% of the local vertical deviation of the non-planar backside surface from the planar horizontal surface to 100% of the local vertical deviation of the non-planar backside surface from the planar horizontal surface. In one embodiment, the non-uniform vertical displacement of the first pins 1210 can be within a range from 40% of the local vertical deviation of the non-planar backside surface from the planar horizontal surface to 80% of the local vertical deviation of the non-planar backside surface from the planar horizontal surface.

In one embodiment, measuring the vertical deviation of the non-planar backside surface from the planar horizontal surface can comprise the steps of: disposing the first wafer 90W on the first chuck (1200, 1210), incrementally moving up the first pins 1210 until each of the first pins 1210 contacts the backside surface of the first wafer 90W, determining the vertical deviation of the non-planar backside surface from the planar horizontal surface by measuring a height of a top portion of each first pin 1210 (for example, by the degree of movement of each stepper motor that drives the first pins 1210) at a time of contact of the respective first pin 1210 with the backside surface of the first wafer 90W.

Alternatively, measurement of the non-planar profile of the backside surface of the first wafer 90W can be performed ex-situ, i.e., on a different tool configured to measure the deformation of the backside surface of the first wafer 90W prior to placing the first wafer on the first chuck (1200, 1210). In this case, the measurement data on the profile of the non-planar backside surface of the first wafer 90W can be transmitted to the computer 1100 to generate target values for the non-uniform vertical displacement of the first pins 1210 to be employed to bond the first wafer 90W to a second wafer 70W.

The second wafer 70W includes a plurality of second semiconductor dies 700. The second wafer 70W can be disposed over the first wafer 90W such that first metal bonding pads located on the bonding-side surface of the first wafer 90W contacts second metal bonding pads located on the bonding-side surface of the second wafer 70W.

A second chuck (2200, 2210) can be disposed on a backside of the second wafer 70W while the second wafer 70W is disposed over the first wafer 90W and over the first chuck (2200, 2210). In one embodiment, the second chuck (2200, 2210) can include second pins 2210. The height of the bottom surface of the second pins 2210 that contact the backside surface of the second wafer 70W can be independently controlled such that the first wafer 90W and the second wafer 70W has enhanced contact through controlled additional deformation by the first pins 1210 and the second pins 2210.

In one embodiment, non-uniform vertical displacement can be provided to the second pins 2210 to provide structural support to the first wafer 90W. In one embodiment, the non-uniform vertical displacement can be provided to the second pins 2210 may be the complement of the non-uniform vertical displacement can be provided to the first pins 1210. In this case, the backside surface of the first wafer 90W and the backside surface of the second wafer 70W can be forced into profiles that are vertically spaced from each other by a uniform distance, which is the sum of the thickness of the first wafer 90W and the thickness of the second wafer 70W.

The second wafer 70W is bonded to the first wafer 90W while the first chuck (1200, 1210) and the second chuck (2200, 2210) press down on the stack of the first wafer 90W and the second wafer 70W. The at least one heater embedded in the first perforated platen 1200 and/or the second perforated platen 2200 can be employed to raise the temperature of the assembly of the first wafer 90W and the second wafer 70W, and to induce metal-to-metal bonding between the first metal bonding pads in the first wafer 90W and the second metal bonding pads in the second wafer 70W. The plurality of second semiconductor dies 700 in the second wafer 70W can be bonded to the plurality of first semiconductor dies 900 in the first wafer 90W while the second chuck (2200, 2210) presses the second wafer 70W against the first wafer 90W. The non-planar surface profile of the bonding-side surface of the first wafer 90W matches the non-planar surface profile of the bonding-side surface of the second wafer 70W due to complementary profiles provided by the non-uniform vertical displacement of the first pins 1210 and the non-uniform vertical displacement of the second pins 2210.

In one embodiment, the plurality of first semiconductor dies 900 comprises a plurality of memory dies including a respective instance of a three-dimensional array of memory elements, and the plurality of second semiconductor dies 700 comprises a plurality of support dies including a respective instance of a peripheral circuitry configured to operate the three-dimensional array of memory elements.

In one embodiment, the first pins 1210 comprises a plurality of groups of first pins, and each group of first pins 1210 among the plurality of groups of first pins comprises a respective set of first pins 1210 that are configured to vertically move by a same vertical displacement distance. Different groups of first pins 1210 are independently controlled to provide independent vertical displacement distances among the different groups. In one embodiment, the plurality of groups of first pins 1210 are spaced apart within the first chuck (1210, 2210) by being located within different azimuthal ranges about a geometrical center CC of the first chuck (1210, 2210) or by being located within different radial distance ranges from the geometrical center CC of the first chuck (1210, 2210).

In one embodiment, the second pins 2210 comprises a plurality of groups of second pins, and each group of second pins 2210 among the plurality of groups of second pins comprises a respective set of second pins 2210 that are configured to vertically move by a same vertical displacement distance. Different groups of second pins 2210 are independently controlled to provide independent vertical displacement distances among the different groups. In one embodiment, the plurality of groups of second pins 2210 are spaced apart within the second chuck (2210, 2210) by being located within different azimuthal ranges about a geometrical center of the second chuck (2210, 2210) or by being located within different radial distance ranges from the geometrical center of the second chuck (2210, 2210).

In one embodiment, the plurality of groups of second pins 2210 can have multiple pin height control zones that is the mirror image of the multiple pin height control zones for the plurality of groups of first pins 1210. In one embodiment, an automated program that runs on the computer 1100 can control the non-uniform vertical displacement of the first pins 1210 and the non-uniform vertical displacement of the second pins 2210 such that the first pins 1210 and the second pins 2210 provide a non-uniform surface profile for contacting the backside surface of the first wafer 90W and for contacting the backside surface of the second wafer 70W with a uniform vertical separation distance between the two non-uniform surface profiles. The uniform vertical separation distance can be the same as the sum of the thickness of the first wafer 90W and the thickness of the second wafer 70W.

Figure 14A:
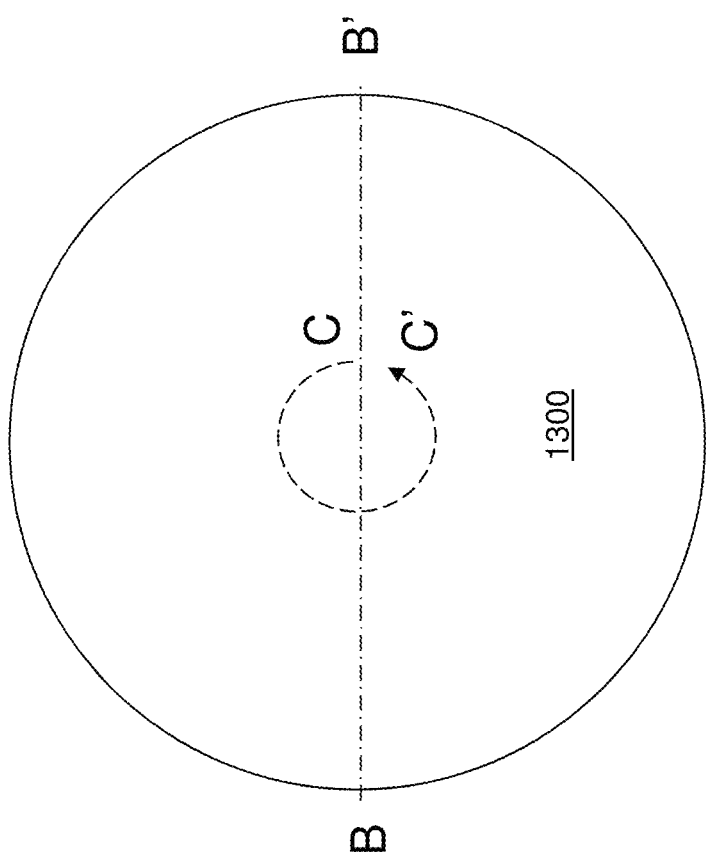
FIG. 14A is a top-down view of an exemplary chuck that may be employed in the exemplary wafer bonding apparatus of FIG. 10A according to a fifth embodiment of the present disclosure.
Figure 14B:
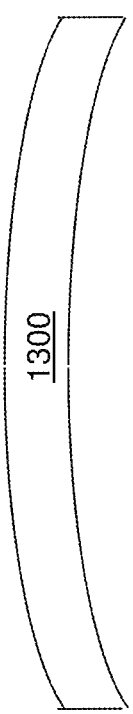
FIG. 14B is a vertical cross-sectional view of the exemplary chuck along the planar vertical cross-sectional plane B-B; of FIG. 14A.
Figure 14C:
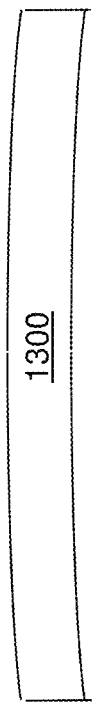
FIG. 14C is a vertical cross-sectional view of the exemplary chuck along the cylindrical vertical cross-sectional plane C-C' of FIG. 14A.
Figures 15A, 15B, 15C:
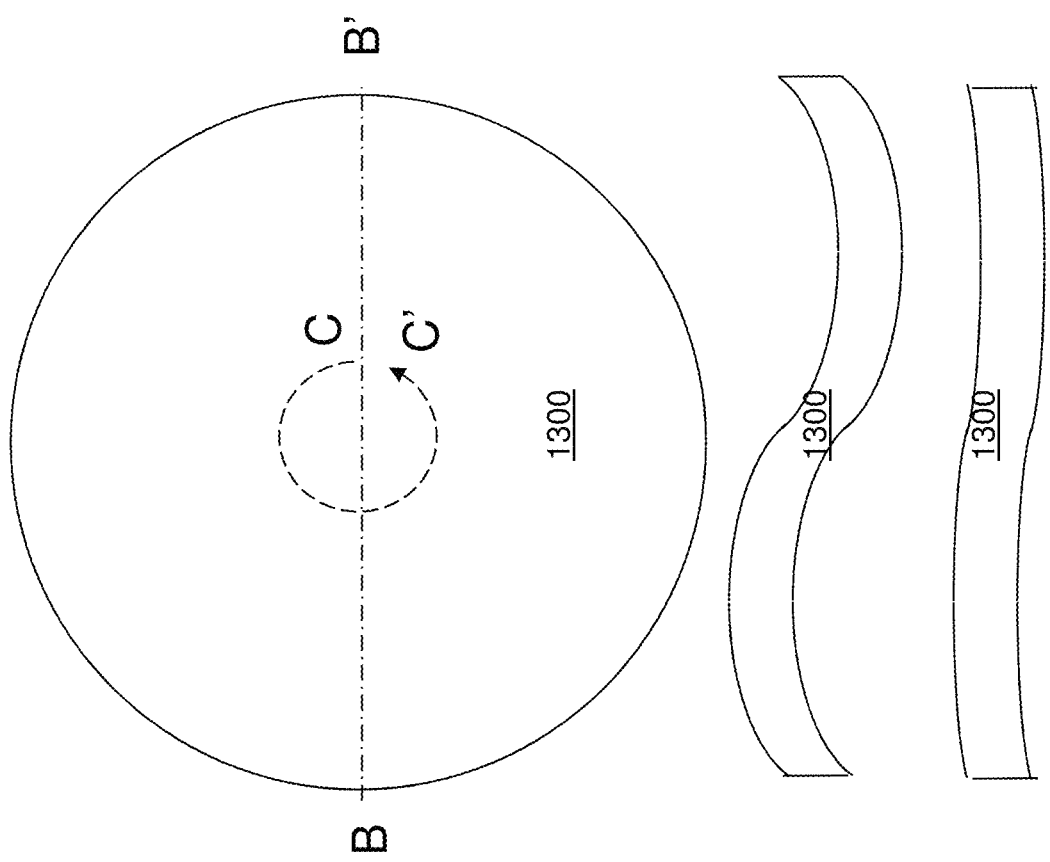
FIG. 15A is a top-down view of another exemplary chuck that may be employed in the exemplary wafer bonding apparatus of FIG. 10A according to the fifth embodiment of the present disclosure.
FIG. 15B is a vertical cross-sectional view of the exemplary chuck along the planar vertical cross-sectional plane B-B; of FIG. 15A.
FIG. 15C is a vertical cross-sectional view of the exemplary chuck along the cylindrical vertical cross-sectional plane C-C' of FIG. 15A.

Referring to FIGS. 14A-14C and 15A-15C, exemplary chucks 1300 according to a fifth embodiment of the present disclosure are illustrated, which may be employed in the exemplary wafer bonding apparatus of FIGS. 10A, 10B, 11, 12, and 13 in lieu of the first chuck (1200, 1210) and/or in lieu of the second chuck (2200, 2200). FIGS. 14A-14C illustrate a first exemplary chuck 1300, and FIGS. 15A-15C illustrate a second exemplary chuck 1300. FIG. 14A is a top-down view of the first exemplary chuck 1300, FIG. 14B is a vertical cross-sectional view of the first exemplary chuck 1300 along a planar vertical cross-sectional plane B-B' illustrated in FIG. 14A, and FIG. 14B is a vertical cross-sectional view of the first exemplary chuck 1300 along a cylindrical vertical cross-sectional plane C-C' illustrated in FIG. 14C. FIG. 15A is a top-down view of the second exemplary chuck 1300, FIG. 15B is a vertical cross-sectional view of the second exemplary chuck 1300 along a planar vertical cross-sectional plane B-B' illustrated in FIG. 15A, and FIG. 15B is a vertical cross-sectional view of the second exemplary chuck 1300 along a cylindrical vertical cross-sectional plane C-C' illustrated in FIG. 15C.

The exemplary chucks 1300 of FIGS. 14A-14C and 15A-15C can include a non-planar platen without openings or pins of the first chuck (1200, 1210) or the second chuck (2200, 2210) illustrated in FIGS. 10A, 10B, 11, 12, and 13. Instead, the optimal bonding profile for a pair of a first wafer 90W and a second wafer 70W can be predetermined based on measurement of deformation profile of wafers having a same structure as the first wafer 90W and of wafers having a same structure as the second wafer 70W.

In one embodiment, the first wafer 90W can include a plurality of memory dies as the plurality of first semiconductor dies 900. Each memory die can include a respective instance of a three-dimensional array of memory elements. The second wafer 70W can include a plurality of support dies as the plurality of second semiconductor dies 700. Each support die can include a respective instance of a peripheral circuitry configured to operate the three-dimensional array of memory elements.

Figure 16:
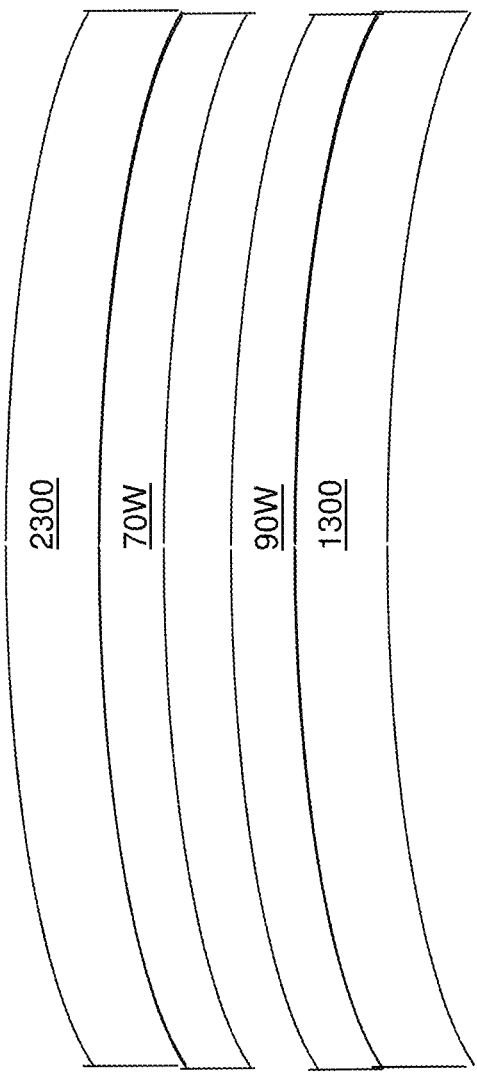
FIG. 16 is a vertical cross-sectional view of a first wafer on a first chuck and a second wafer on a second chuck prior to bonding the second wafer with the first wafer according to the fifth embodiment of the present disclosure.

Referring to FIG. 16, a stack of a first wafer 90W and a second wafer 70W can be disposed between a first chuck 1300 and a second chuck 2300. The first wafer 90W can be disposed directly on the top surface of the first chuck 1300, and the second wafer 70W can be disposed directly underneath the bottom surface of the second chuck 2300. The orientations and lateral displacement of the first wafer 90W and the second wafer 70W can be adjusted so that each mating pair of a first metal bonding pad in the first wafer 90W and a second metal bonding pad in the second wafer 70W face each other.

The contact surface (i.e., the top surface) of the first chuck 1300 and the contact surface (i.e., the bottom surface) of the second chuck 2300 can have a complementary non-planar surface profile. In other words, if the second chuck 2300 were to be lowered to the first chuck 1300 without the stack of the first wafer 90W and the second wafer 70W, the entire area of the non-planar bottom surface of the second chuck 2300 would contact the entire area of the non-planar surface of the first chuck 1300.

The first wafer 90W has a first top surface (i.e., a bonding-side surface) having a plurality of first metal bonding pads, and the second wafer 70W can have second top surface (i.e., a bonding-side surface) having a plurality of second metal bonding pads. The first top surface of the first wafer 90W can be a non-planar surface, and the second top surface of the second wafer 70W can be non-congruent with the non-planar surface of the first wafer 90W. Thus, as provided and prior to being pressed by the non-planar platen of the chuck, a stack of the first wafer 90W and the second wafer 70W can have irregular gaps therebetween.

In one embodiment, the first top surface of the first wafer 90W as provided can be an initial first non-planar surface, and the second top surface of the second wafer 70W as provided can be an initial non-planar surface that is not congruent with the initial first non-planar surface of the first wafer 90W. A non-planar bonding interface between the first wafer 90W and the second wafer 70W can be formed. A modified first non-planar surface of the first wafer 90W can contact a modified second non-planar surface of the second wafer 70W at the non-planar bonding interface. The non-planar bonding interface can be formed by conforming the first wafer 90W and the second wafer 70W to a complementary set of non-planar surface profiles provided by the first chuck and the second chuck.

A non-uniform force is applied across the area of the interface between the first wafer 90W and the second wafer 70W by the pair of the first chuck 1300 and the second chuck 2300 to provide an increased contact area between the first wafer 90W and the second wafer 70W during bonding of the second wafer to the first wafer. The stack of the first wafer 90W and the second wafer 70W is disposed between the first chuck 1300 and the second chuck 2300. The first chuck 1300 applies a first distributed force that supports a first non-planar backside surface of the first wafer 90W, and the second chuck 2300 applies a second distributed force that supports a second non-planar backside surface of the second wafer 70W.

In one embodiment, the first distributed force and the second distributed force have respective spatial distributions such that the first non-planar backside surface of the first wafer 90W is spaced apart by a uniform distance from the second non-planar backside surface of the second wafer 70W along a separation direction between the first chuck 1300 and the second chuck 2300. The first chuck 1300 can be the medium through which the first distributed force is applied, and the second chuck 2300 can be the medium through which the second distributed force is applied.

In one embodiment, the combination of the first chuck (1200, 1210) and the second chuck (2200, 2210) illustrated in FIGS. 10A, 10B, 11, 12, and 13 can be employed in lieu of the first chuck 1300 and the second chuck 2300 to bond the first wafer 90W to the second wafer 70W. In this case, the height profile of the top surfaces of the first pins 1210 can be congruent with the height profile of the bottom surfaces of the second pins 2210. The first pins 1210 can be the medium through which the first distributed force is applied, and the second pins 2210 can be the medium through which the second distributed force is applied. In one embodiment, the first chuck (1200, 1210) can comprise a plurality of first pins 1210 configured to provide an azimuthally and/or radially dependent displacement of the first non-planar backside surface of the first wafer 90W during bonding of the second wafer 70W to the first wafer 90W, and the second chuck (2200, 2210) can comprise a plurality of second pins 2210 configured to provide an azimuthally and/or radially dependent displacement of the second non-planar backside surface of the second wafer 70W during bonding of the second wafer 70W to the first wafer 90W. In this case, the azimuthally and/or radially dependent displacement of the second non-planar backside surface of the second wafer 70W can have a complementary pattern of the pattern of the azimuthally and/or radially dependent displacement of the first non-planar backside surface of the first wafer 90W so that the second non-planar backside surface of the second wafer 70W is vertically spaced from the first non-planar backside surface of the first wafer 90W by a uniform vertical distance.

Figure 17:
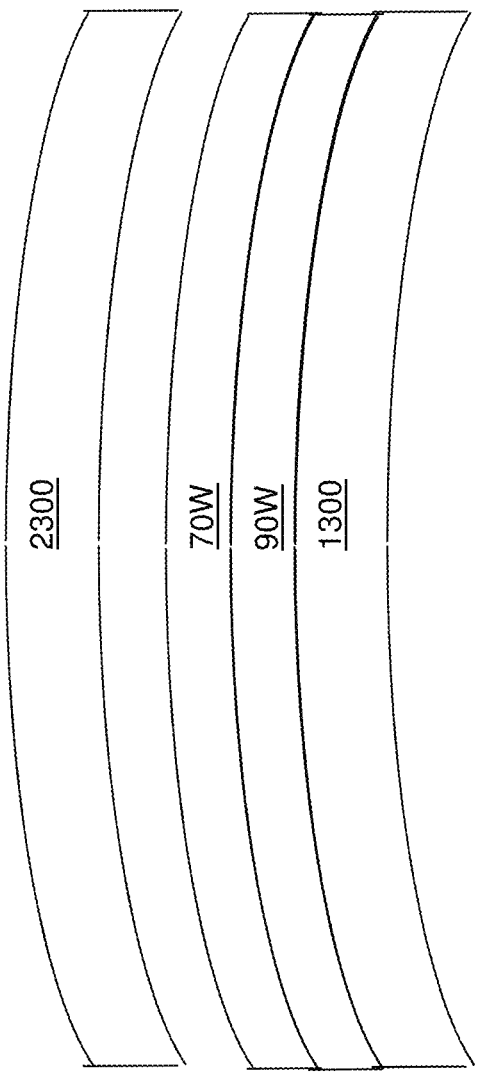
FIG. 17 is a vertical cross-sectional view of a bonded assembly of the first wafer and the second wafer according to the fifth embodiment of the present disclosure.

Referring to FIG. 17, the second wafer 70W can be bonded to the first wafer 90W face to face while an interface between the first wafer 90W and the second wafer 70W is in a non-Euclidean two-dimensional plane. Thus, the first wafer 90W and the second wafer 70W are bonded to each other at a non-planar bonding interface, which may be a surface that distributes an external stress for providing the non-uniform interface between the first wafer 90W and the second wafer 70W approximately evenly. The plurality of second metal bonding pads in the second wafer 70W can be bonded to the plurality of first metal bonding pads in the first wafer 90W by metal-to-metal bonding during the bonding of the second wafer 70W to the first wafer 90W.

Figure 18A:
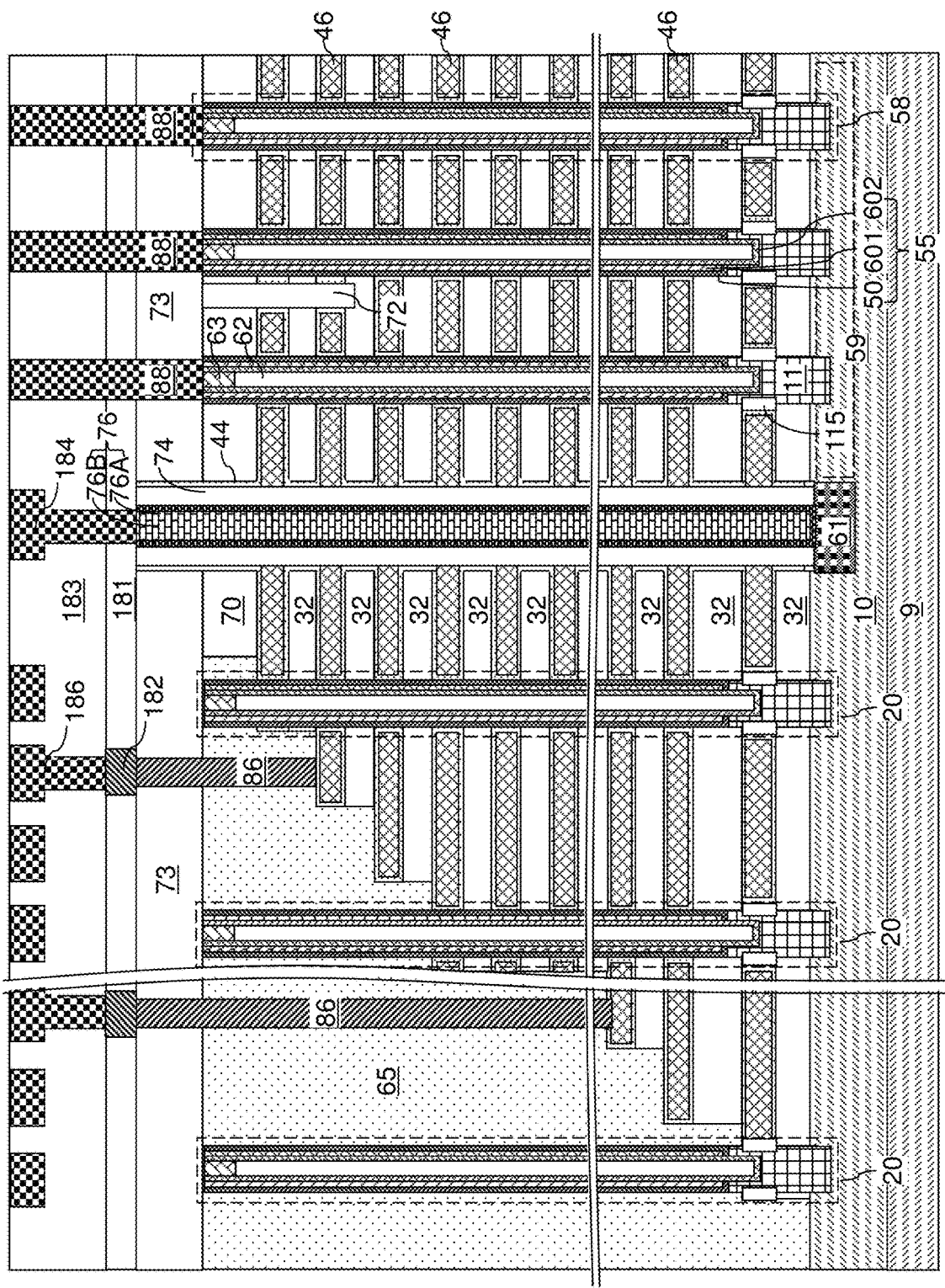
FIG. 18A is a vertical cross-sectional view of an in-process memory die after formation of contact via structures according to an embodiment of the present disclosure.
Figure 18B:
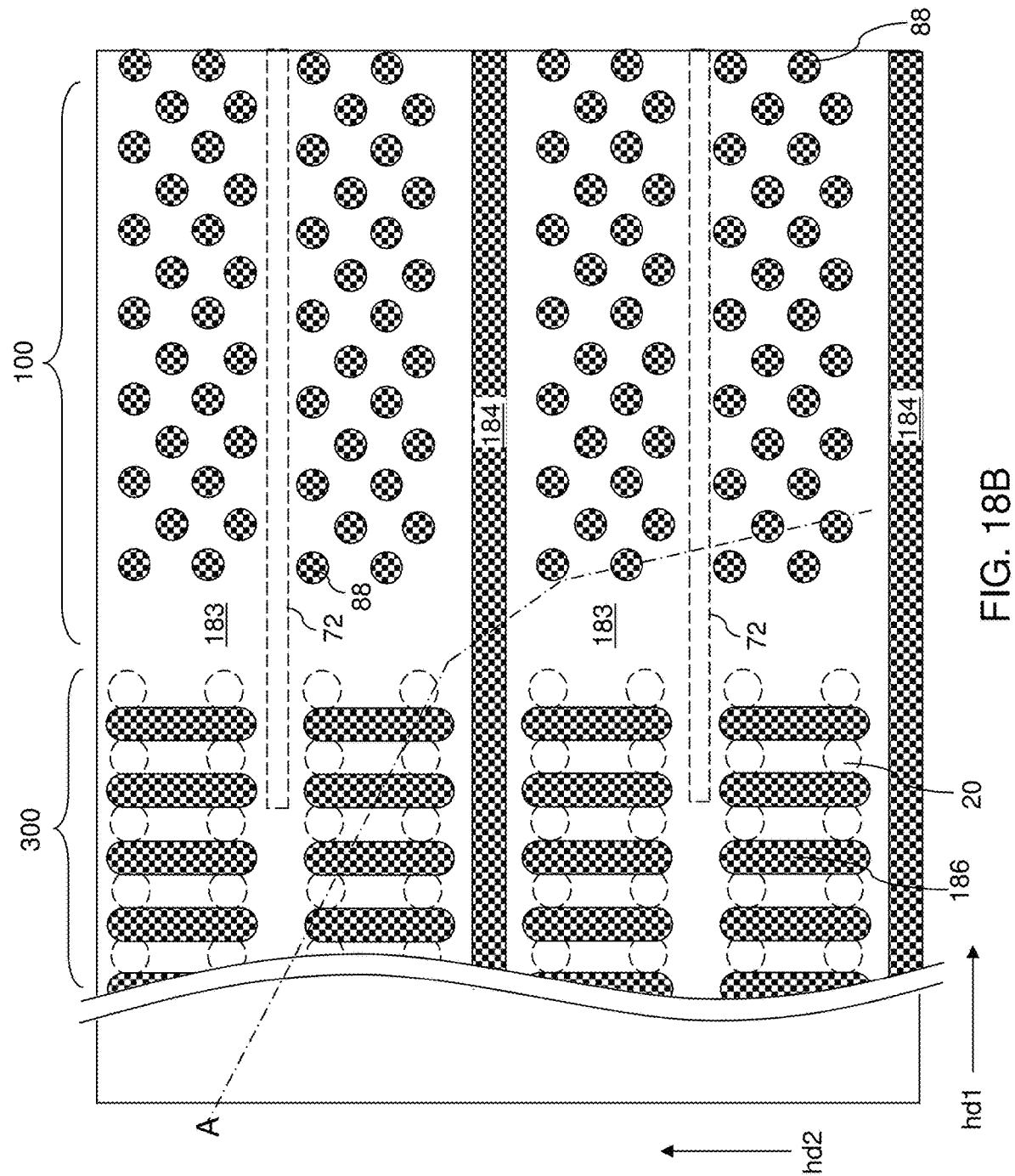
FIG. 18B is a top-down view of the in-process memory die of FIG. 18A.

FIGS. 18A and 18B illustrate an exemplary in-process memory die, which may be employed to provide a first semiconductor die 900 illustrated above. The in-process memory die can be formed on a substrate including a substrate semiconductor layer 9 and an optional semiconductor material layer 10. An alternating stack of insulating layers 32 and sacrificial material layers (not shown) are formed. An insulating cap layer 70 can be formed over the alternating stack. Drain-select-level isolation structures 72 may be optionally formed through topmost layers of the alternating stack. The insulating cap layer and the alternating stack can be patterned to form stepped surfaces, and a retro-stepped dielectric material portion 65 can be formed over the stepped surfaces. Memory openings can be formed through the insulating cap layer 70 and the alternating stack to a top surface of the substrate (9, 10). Support openings can be formed through the retro-stepped dielectric material portion 65 and patterned portions of the alternating stack to a top surface of the substrate (9, 10). A memory opening fill structure 58 can be formed in each memory opening, and a support pillar structure 20 can be formed in each support opening. Each memory opening fill structure 58 and each support pillar structure 20 can include a pedestal channel portion 11, a memory film 50 that can include a layer stack, from outside to inside, of a blocking dielectric, a charge storage layer, and a tunneling dielectric, a vertical semiconductor channel 60 that can include a first semiconductor channel layer 601 and a second semiconductor channel layer 602, an optional dielectric core 62, and a drain region 63. A lower contact level dielectric layer 73 can be formed over the insulating cap layer 70 and the retro-stepped dielectric material portion 65. Backside trenches can be formed through the lower contact level dielectric layer 73 and the alternating stack to a top surface of the substrate (9, 10). Backside recesses can be formed by removing the sacrificial material layers. Physically exposed surfaces of the pedestal channel portions can be oxidized to form tubular dielectric spacers 115. The sacrificial material layers can be replaced with an optional backside blocking dielectric liner 44 and electrically conductive layers 46 that include word lines. Portions of the charge storage layer that are surrounded by the word lines constitute memory elements, which are arranged as a three-dimensional array memory elements. A source region 61 can be formed at the bottom of each backside trench. A horizontal semiconductor channel 59 is formed between each source region 61 and a neighboring group of pedestal channel portions 11 in the memory openings. An insulating spacer 74 and a source contact structure 76 can be formed in each backside trench. The set of all semiconductor devices located below the top surface of the lower contact level dielectric layer 73 correspond to the first semiconductor devices 920 described above.

Layer contact via structures 86 including word line contact via structures can be formed on each electrically conductive layer 46. A middle contact level dielectric layer 181 can be deposited over the lower contact level dielectric layer 73. Contact-connection line structures 182 can be formed on top of the layer contact via structures 181 in the middle contact level dielectric layer. An upper contact level dielectric layer 183 can be formed over the middle contact level dielectric layer 181. Contact via cavities can be formed through the upper contact level dielectric layer 183, optionally through the middle contact level dielectric layer 181, and optionally through the lower contact level dielectric layer 73, for example, by a combination of a lithographic patterning process and an anisotropic etch process. Optionally, a line pattern can be formed in an upper region of a subset of the contact via cavities. Various contact via structures (88, 184, 186) can be formed through the upper contact level dielectric layer 183, the middle contact level dielectric layer 181, and the lower contact level dielectric layer 73. The contact via structures (88, 184, 186) can include drain contact via structures 88 that contact drain regions 63, word-line-connection contact via structures 186 that are formed on a top surface of a respective one of the contact-connection line structures 182, and source-connection contact via structures 184 that are formed on a top surface of a respective one of the source contact structures 76.

Figure 19A:
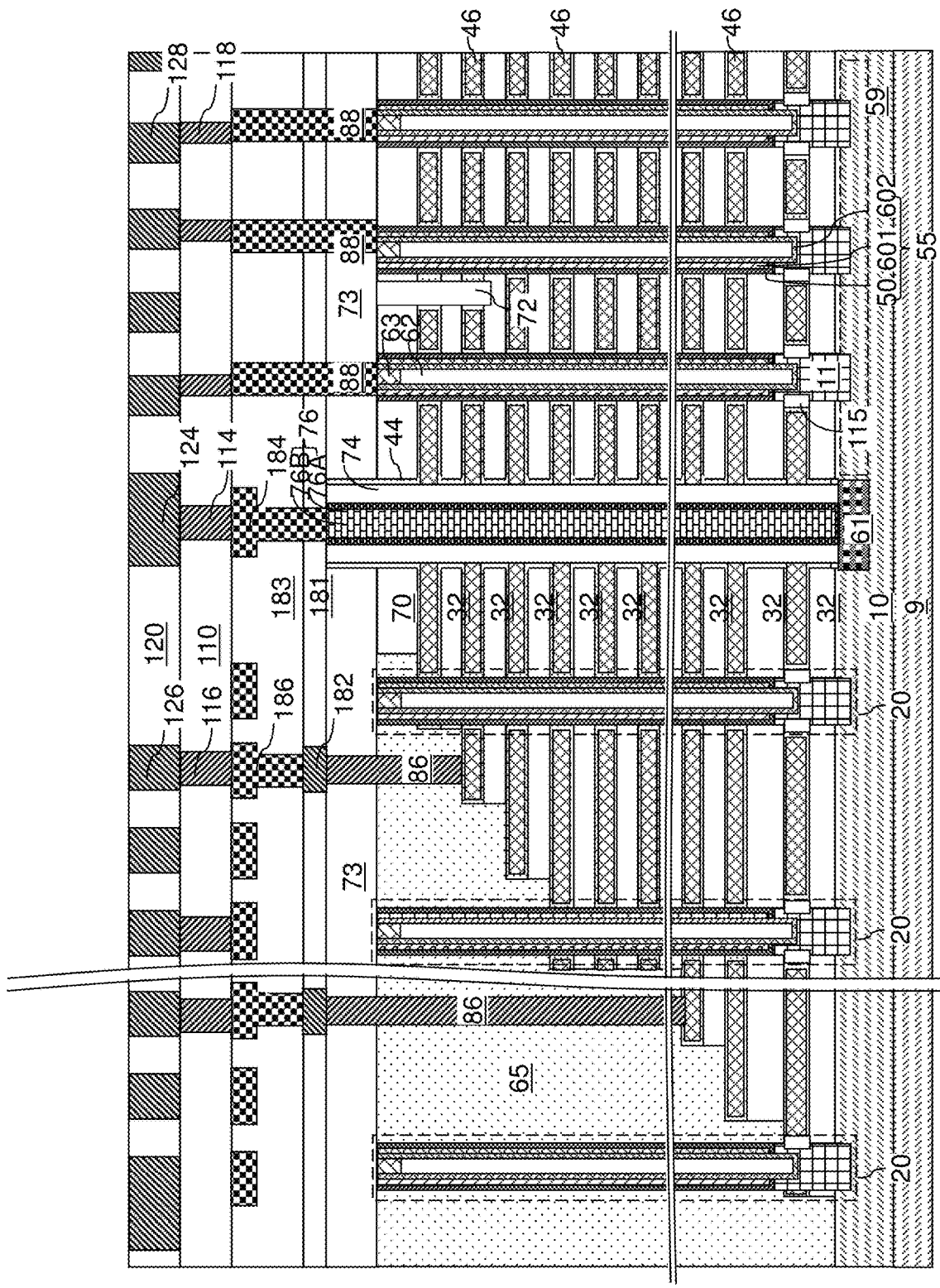
FIG. 19A is a vertical cross-sectional view of the in-process memory die after formation of bit line level structures according to an embodiment of the present disclosure.
Figure 19B:
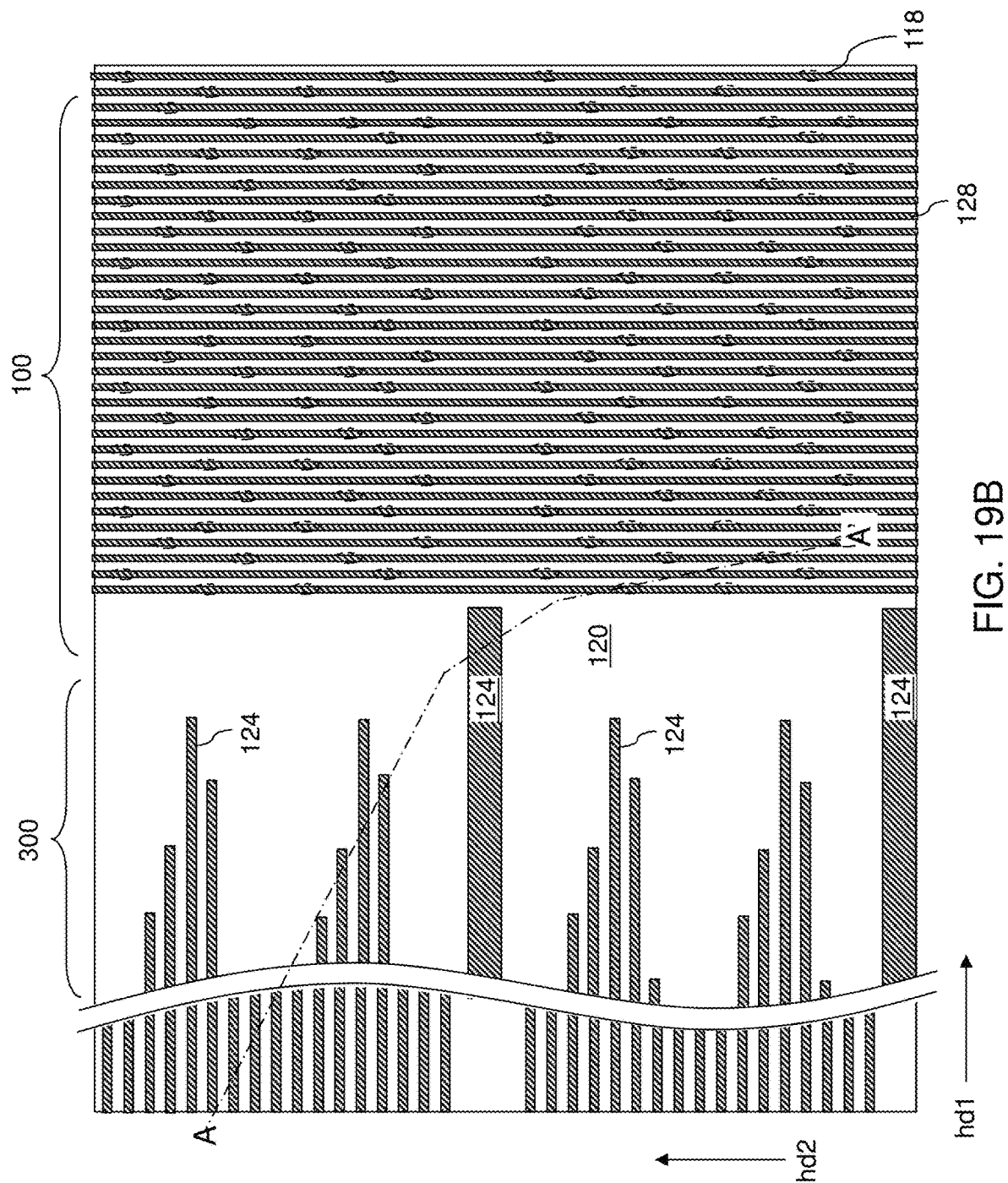
FIG. 19B is a top-down view of the in-process memory die of FIG. 19A.

Referring to FIGS. 19A and 19B, a first via level dielectric layer 110 can be deposited over the upper contact level dielectric layer 183. Various first via structures (118, 114, 116) are formed in the first via level dielectric layer 110. The first via structures (118, 114, 116) can include bit-line-connection via structures 118 that are formed on a top surface of a respective one of the drain contact via structures 88, first source-connection via structures 114 that are formed on a top surface of a respective one of the source-connection contact via structures 184, and first word-line-connection via structures 116 that are formed on a top surface of a respective one of the word-line-connection contact via structures 186.

A first line level dielectric layer 120 can be deposited over the first via level dielectric layer 110. Various first line structures (128, 124, 126) are formed in the first line level dielectric layer 120. The first line structures (128, 124, 126) can include bit lines 128 that are formed on a top surface of a respective one of the bit-line-connection via structures 118, first source-connection line structures 124 that are formed on a top surface of a respective one of the first source-connection via structures 114, and first word-line-connection line structures 126 that are formed on a top surface of a respective one of the first word-line-connection via structures 116.

Figure 20A:
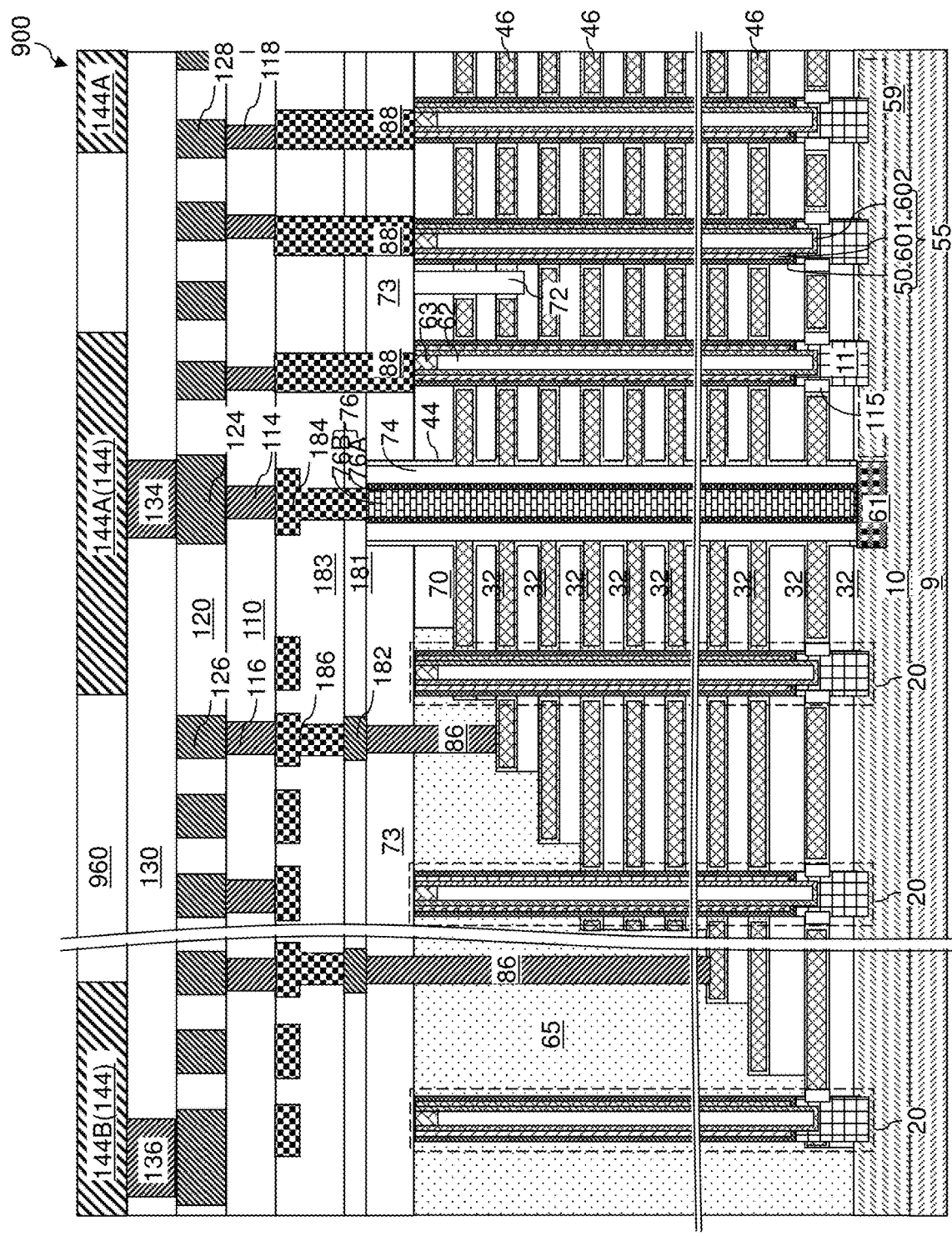
FIG. 20A is a vertical cross-sectional view of a memory die after formation of first metal bonding pads according to an embodiment of the present disclosure.
Figure 20B:
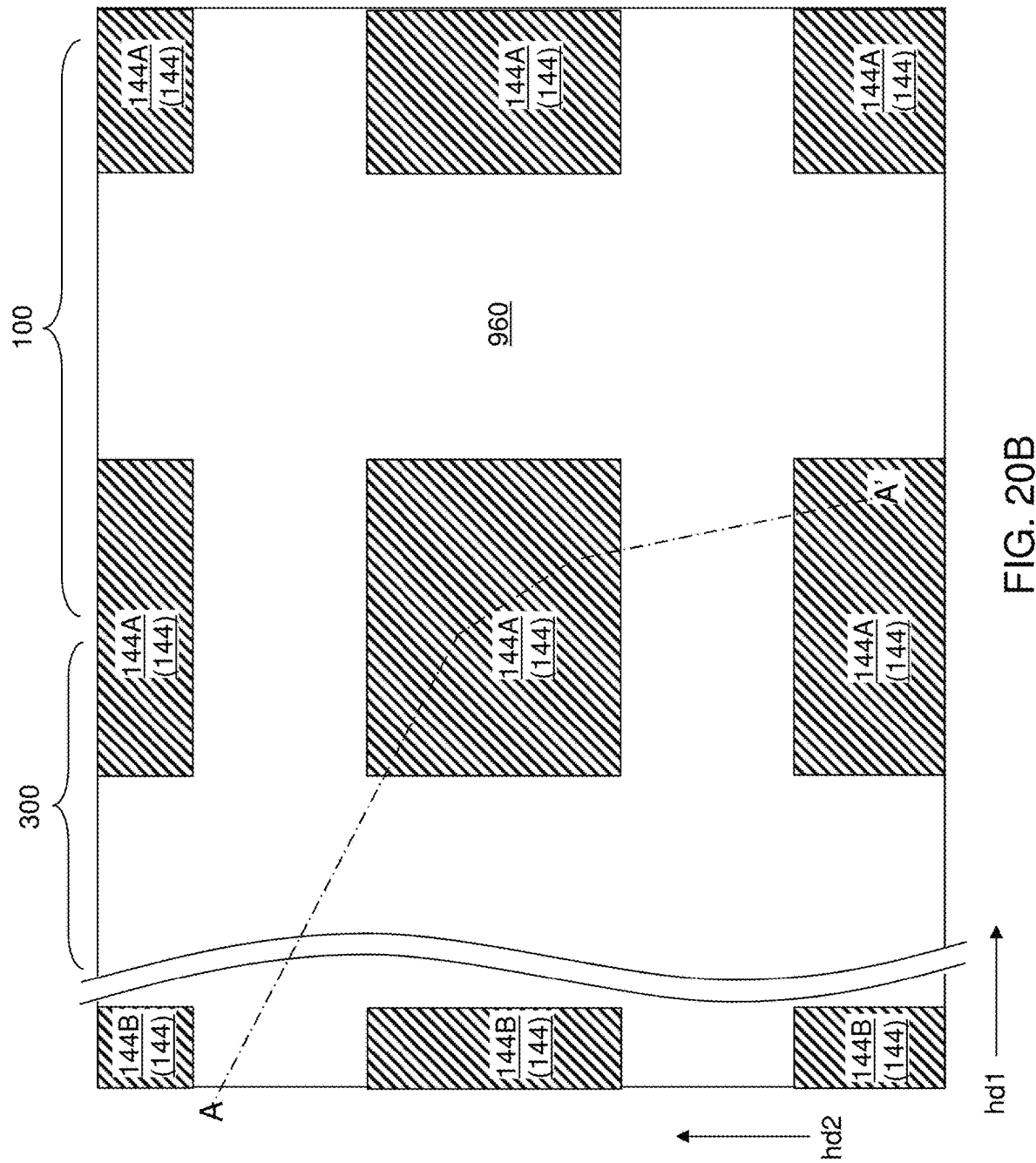
FIG. 20B is a top-down view of a region of the memory die of FIG. 20A.
Figure 20C:
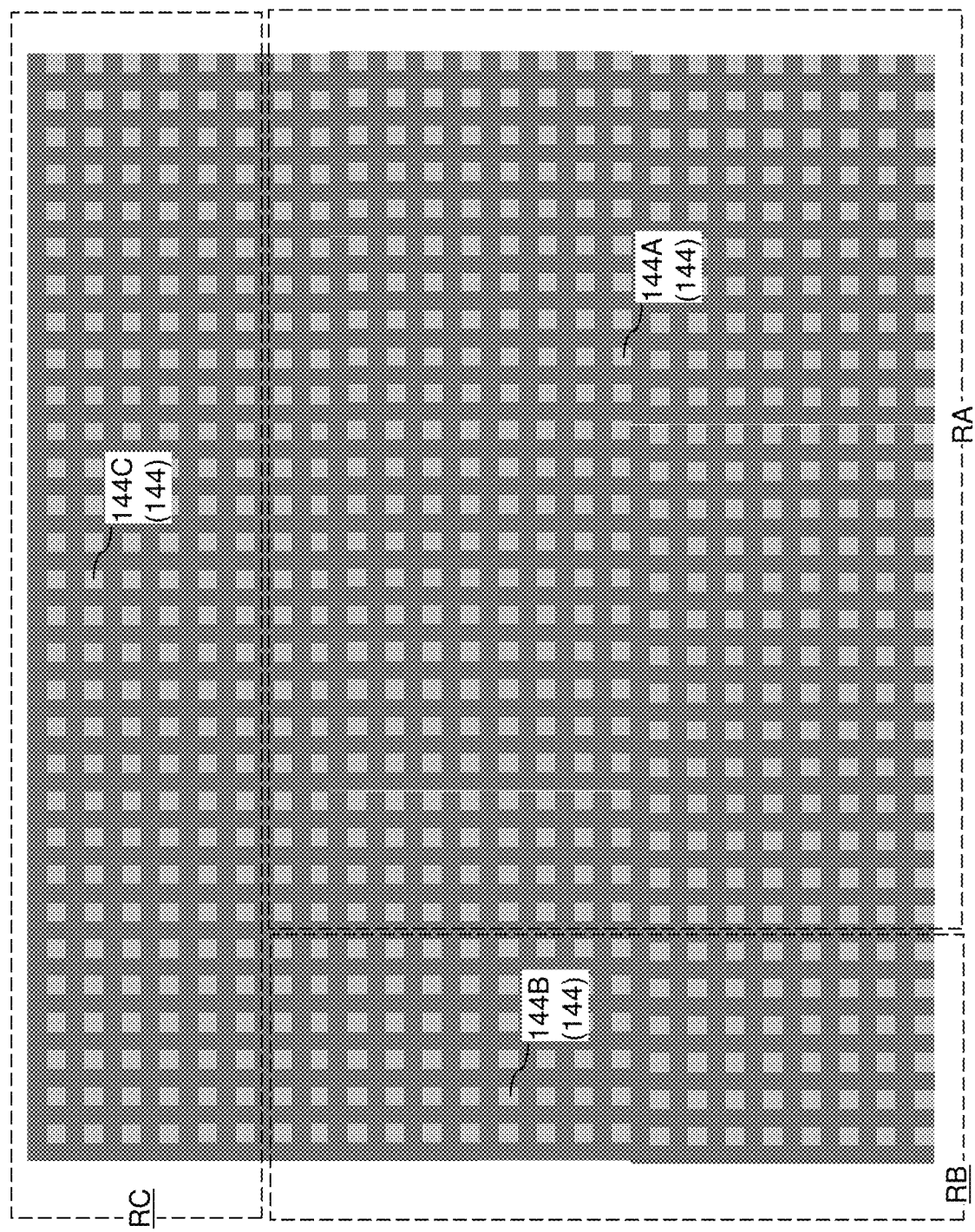
FIG. 20C is a top-down view of the memory die of FIG. 20A.

Referring to FIGS. 20A-20C, a second via level dielectric layer 130 can be deposited over the upper contact level dielectric layer 183. Second via structures (134, 136). The second via structures (134, 136) can include second source-connection via structures 134 that are formed on a respective one of the first source-connection line structures 124, second word-line-connection via structures 136 that are formed on a respective one of the word-line-connection line structures 126, and bit-line-connection via structures (not shown) that are formed on a top surface of a respective one of the bit lines 128. The set of all metal interconnect structures located within, or below, the second via level dielectric layer 130 corresponds the first metal interconnect structures 970 described above.

A first pad-level dielectric layer 960 can be formed over the second via level dielectric layer 130. First metal bonding pads 144 can be formed employing the methods described above. The first metal bonding pads 144 can include source-network first metal bonding pads 144A, word-line-connection first metal bonding pads 144B, bit-line-connection first metal bonding pads 144C, and additional first metal bonding pads for transmitting or receiving power or signals between the memory die (which can be employed as a first semiconductor die 900) and a support die to be subsequently bonded to the memory die.

Figure 21:
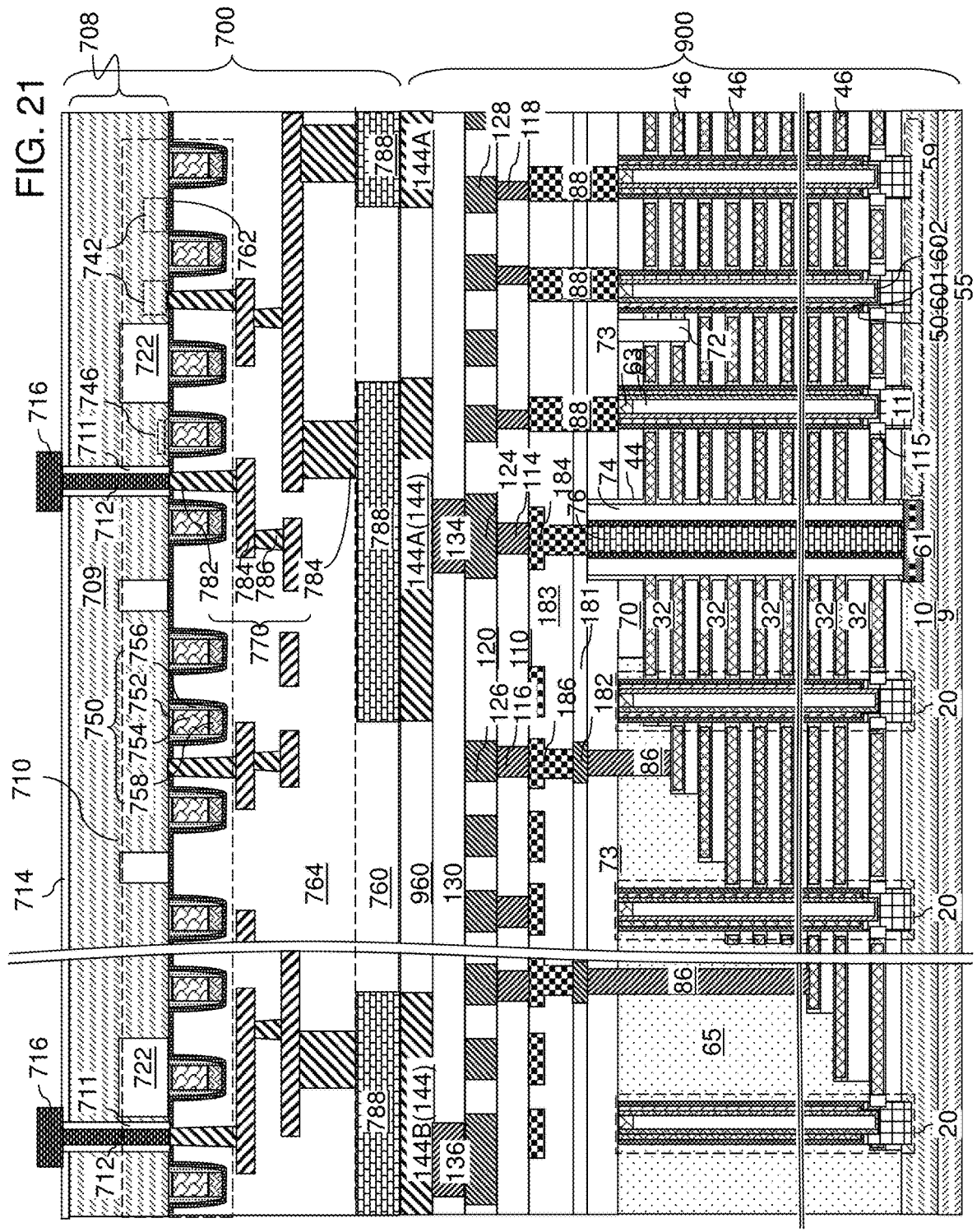
FIG. 21 is an exemplary assembly of a memory die and a support die.

Referring to FIG. 21, the first wafer including multiple instances of the first semiconductor die 900 illustrated in FIGS. 20A-20C can be bonded to a second wafer including a plurality of instances of a second semiconductor die 700 (which may be a support die) employing the methods described above.

In an illustrative example, each support die 700 can include a support-die substrate 708, which can be a semiconductor substrate. The support-die substrate 708 can include a substrate semiconductor layer 709. Shallow trench isolation structures 722 can be provided in a surface region of the substrate semiconductor layer 709 to provide electrical isolation among semiconductor devices of the peripheral circuit. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 900, which are embodied as the electrically conductive layers 46, and source power supply field effect transistors that generate power to be supplied to the source regions 61 the memory die 900

Dielectric material layers are formed over the semiconductor devices 710, which are herein referred to as interconnect-level dielectric layers 764. Optionally, a dielectric liner 762 (such as a silicon nitride liner) can be formed to apply mechanical stress to the various field effect transistors and/or to prevent diffusion of hydrogen or impurities from the interconnect-level dielectric layers 760 into the semiconductor devices 710. Second metal interconnect structures 770 are embedded within the interconnect-level dielectric layers 764. The second metal interconnect structures 770 can include various device contact via structures 782 (e.g., source and drain electrodes which contact the respective source and drain nodes of the device or gate electrode contacts), interconnect-level metal line structures 784, and interconnect-level metal via structures 786. A second pad-level dielectric layer 760 is formed on the interconnect-level dielectric layers 7764. Second metal bonding pads 788 are formed in the second pad-level dielectric layer 760 as described above. The second metal bonding pads 788 are configured to mate with the first metal bonding pads 144 to provide electrically conductive paths between the memory die 900 and the support die 700.

The second metal bonding pads 788 of the support die 700 are bonded to the first metal bonding pads 144 of the memory die 900 employing the method described above. In one embodiment, the memory dies 900 in the first wafer and the support dies 700 in the second wafer can be bonded to each other by metal-to-metal bonding. For example, metal-to-metal bonding between an array of second metal bonding pads 788 and the array of first metal bonding pads 144 can be induced, for example, by a thermal anneal performed at an elevated temperature.

The substrate semiconductor layer 709 can be thinned after bonding the second wafer to the first wafer, for example, by grinding. The thickness of the substrate semiconductor wafer 709 may be in a range from 5 microns to 60 microns. A backside insulating layer 714 can be formed the backside surface of thinned substrate semiconductor layer 709. Laterally-insulated through-substrate via structures (711, 712) can be formed through the support-die substrate 708 to provide electrical contact to various input nodes and output nodes of the first and second periphery circuitries. Each laterally-insulated through-substrate via structure (711, 712) includes a through-substrate conductive via structure 712 and a tubular insulating liner 711 that laterally surrounds the through-substrate conductive via structure 712. Logic-side external bonding pads 716 can be formed on surface portions of the laterally-insulated through-substrate via structures (711, 712). The bonded assembly of the first wafer and the second wafer can be subsequently diced to provide multiple bonded chips, which are memory chips including a respective bonded assembly of a memory die and a support die.

The methods of the present disclosure facilitate bonding between the first wafer and the second wafer in case at least one of the first wafer and the second wafer has a significant deformation that can affect the bonding yield. By matching the surface profile of the two bonding-side surfaces at the time of bonding, the bonding yield can be increased for bonded semiconductor dies.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
   providing a first semiconductor die including first semiconductor devices, first metal interconnect structures, and first metal bonding pads having first concave top surfaces and embedded in a first pad-level dielectric layer;
   forming metallic bump portions directly on the first concave top surfaces of the first metal bonding pads while a top surface of the first pad-level dielectric layer is physically exposed by selectively depositing a metallic material on the first concave top surfaces of the first metal bonding pads employing a selective metal deposition process while suppressing growth of the metallic material on the physically exposed top surface of the first pad-level dielectric layer;
   providing a second semiconductor die including second semiconductor devices, second metal interconnect structures, and second metal bonding pads; and
   attaching the second semiconductor die to the first semiconductor die by bonding the second metal bonding pads to the metallic bump portions via metal-to-metal bonding;
   wherein:
   the metallic bump portions have a greater thickness at a center portion than at an edge portion during the selective metal deposition process;
   the second metal bonding pads have second concave top surfaces; and
   the center portions of the metallic bump portions contact the second concave top surfaces of the second metal bonding pads.

2. The method of claim 1, wherein the selective metal deposition process comprises a selective metal chemical vapor deposition process.

3. The method of claim 2, wherein the metallic bump portions consist essentially of an elemental metal selected from cobalt, ruthenium, and molybdenum.

4. The method of claim 1, wherein the selective metal deposition process comprises an electroplating process or an electroless plating process.

5. The method of claim 4, wherein the metallic bump portions consist essentially of at least one electroless platable or electroplatable metal selected from cobalt, gold, silver, copper, nickel, tin, a tin-lead alloy, brass, cadmium, palladium, zinc, a cobalt-tungsten-phosphorus alloy, a combination thereof, or an alloy thereof.

6. The method of claim 4, wherein the selective metal deposition process comprises a superfill process for electroplating that provides a greater thickness for center regions of the metallic bump portions than edge regions of the metallic bump portions.

* * * * *